United States Patent
Sasaki

[11] Patent Number: 6,053,395
[45] Date of Patent: Apr. 25, 2000

[54] METHOD OF FLIP-CHIP BONDING BETWEEN A CHIP ELEMENT AND A WAFER-BOARD

[75] Inventor: Junichi Sasaki, Tokyo, Japan

[73] Assignee: NEC Corporation, Tokyo, Japan

[21] Appl. No.: 09/130,017

[22] Filed: Aug. 6, 1998

[30] Foreign Application Priority Data

Aug. 6, 1997 [JP] Japan ................................ 9-211828

[51] Int. Cl.[7] .............................. B23K 35/38; H05K 3/34
[52] U.S. Cl. .................. 228/180.22; 228/205; 228/234.1
[58] Field of Search ............................ 228/180.22, 205, 228/207, 223, 180.21, 234.1

[56] References Cited

U.S. PATENT DOCUMENTS

| | | | |
|---|---|---|---|
| 4,273,593 | 6/1981 | Mastrangelo | 148/24 |
| 5,005,757 | 4/1991 | Kornely, Jr. et al. | 228/178 |
| 5,560,100 | 10/1996 | Englert | 29/833 |
| 5,637,149 | 6/1997 | Banks et al. | 118/425 |

OTHER PUBLICATIONS

C.A. Armiento et al., "Gigabit Transmitter Array Modules on Silicon Waferboard", pp. 1072–1080, IEEE Transactions on Components, Hybrids, and Manufacturing Technology, vol. 15, No. 6, Dec. 1992.

*Primary Examiner*—Samuel M. Heinrich
*Attorney, Agent, or Firm*—Young & Thompson

[57] ABSTRACT

A method of bonding a chip element to a wafer-board through at least a solder bump having a surface coated with an oxide layer placed between the chip element and the wafer-board is provided. The method comprises the following steps. The oxide layer coating the surface of the solder bump is exposed to a liquid. An energy is given to the solder bump both for melting the solder bump and for causing at least one of a convection and a cavitation of at least an adjacent part of the liquid to the oxide layer, so as to allow the at least one of the convection and the cavitation to remove the oxide layer from the surface of the solder bump, whereby the solder bump bonds the chip element and the wafer-board.

51 Claims, 9 Drawing Sheets

HEAT TREATMENT

METHOD OF FLIP-CHIP BONDING BETWEEN A CHIP ELEMENT AND A WAFER-BOARD

BACKGROUND OF THE INVENTION

The present invention relates to a method of packaging chip elements such as semiconductor devices and optical devices onto a wafer-board, and more particularly to a of packaging chip elements onto a wafer-board by a flip-chip bonding method.

In recent years, a flip-chip bonding has been attractive as being effective for satisfying the requirements for scaling down of the package and a reduction in thickness of the package as well as a reduction in manufacturing cost of packaging the chip element onto the wafer-board. The flip-chip bonding is conducted by use of solder bumps between the wafer-board and the chip element.

In general, the solder bumps are first provided on the wafer-board whilst solder bonding pads are provided on the chip elements at corresponding positions to the solder bumps on the wafer-board. The chip element is placed on the wafer-board before the solder bumps are heated to be melt for bonding the chip element to the wafer-board.

If the solder bumps is formed by a plating method or a press-punching method, then an oxide layer resides on a surface of each of the solder bumps, for which reason it is necessary to remove the oxide layer from the surface of the solder bump so as to permit the melt solder bump is securely bonded onto the corresponding solder bonding pad on the chip element.

FIGS. 1A through 1D are fragmentary cross sectional elevation views illustrative of wafer-boards with solder bumps to be bonded with solder bonding pads on chip elements in sequential steps involved in a conventional flip-chip bonding method of bonding a chip element onto a wafer-board.

With reference to FIG. 1A, a solder bump 2 is provided on a silicon wafer-board 1, wherein the solder bump 2 has a surface coated with an oxide layer 3.

With reference to FIG. 1B, a flux 7 is applied on the silicon wafer-board 1. Further a chip element 5 having a solder bonding pad 4 is placed over the silicon wafer-board 1 so that the solder bonding pad 4 is made into contact with a top portion of the oxide layer 3 covering the surface of the solder bump 3 on the silicon wafer-board 1 and the surface of the chip element is made into contact with the flux 7 applied on the silicon wafer-board 1 so that a gap between the silicon wafer-board 1 and the chip element 5 is filled with the flux 7. The oxide layer 3 is also in contact with the flux 7.

With reference to FIG. 1C, the silicon wafer-board 1 with the chip element 5 is subjected to a heat treatment in a reflow furnace to cause that the solder bump 2 is melt whilst the oxide layer 3 is reduced by an activation function of the flux 7.

With reference to FIG. 1D, the solder bump 2 is melt to be deformed and is made into contact directly with the solder bonding pad 4 provided on the chip element 5, whereby the chip element 5 is bonded to the silicon wafer-board 1 through the solder bump 2.

The above conventional flip-chip bonding method is disclosed in IEEE Trans. Components Hybrids and Manufacturing Technology, vol. 15, No. 6, pp. 1072–1080.

The above first conventional packaging method has the following problems.

Since the flux is used for reduction of the oxide layer on the surface of the solder bump in the heat treatment process, any component capable of causing oxidation and corrosion is likely to reside around the bump-bonding position, whereby the chip element or metal portions of the silicon wafer-board might be oxidized or corroded. As a result, deteriorations are caused of electric characteristic and properties and reliability of the packaged device.

Further, if the chip element comprises an optical device, a residue of the flux might be adhered on a light-emission area whereby an output characteristic and a sensitivity are deteriorated.

Further more, it is required that the chip element is so placed on the silicon wafer-board that the solder bump pad is made into contact with the oxide layer coating the surface of the solder bump. If the size of the solder bump is small, a highly accurate alignment of the chip element to the silicon wafer-board is also required.

In Japanese laid-open patent publication No. 6-196486, it is disclosed that a bump coated with an oxide layer is provided on a wafer-board before the bump is melt to be adhered on the wafer-board for a wet back process, wherein an ultrasonic vibration is applied to the bump for removal of the oxide layer and also causing the bump to be melt for the wet back process before a chip element is bonded through the bump onto the wafer-board without applying the ultrasonic vibration to the chip element. For this reason, the chip element is free from any problem with a damage due to the application of the ultrasonic vibration.

The above second conventional packaging method has a problem with the increase in manufacturing cost because it is required to provide an ultrasonic vibrator for applying the ultrasonic vibration to the solder bump with the oxide layer. It is further required to adjust the vibration with complicated operations for remove the oxide layer.

In Japanese laid-open patent publication No. 3-218645, it is disclosed that, without using any flux, a solder bump on a chip element is provisionally bonded onto a metal thin film provided on an electrode on a printed wiring board for subsequent immersion into a heat solution so that the solder bump is melt to bond the chip element to the printed wiring board.

The above third conventional packaging method has the following problem. If the solder bump is formed by an evaporation, the evaporation is conduced in a vacuum. To make the vacuum is costly process. If, however, the solder bump is formed by a plating method, then there are variations in plating solution concentration and current density, for which reason it is difficult to form a uniform solder bump.

Further, it is required to conduct a process of immersion of the wafer-board with the chip element into a solution such as a glycerin solution maintained at a higher temperature of, for example, 250° C. than a melting point of the solder for causing the solder bump to be melt. This means it takes a further processing time to conduct the flip-chip bonding.

In the above circumstances, it had been required to develop a novel method of a flip-chip bonding between a chip element and a wafer-board through solder bumps free from the above problems.

SUMMARY OF THE INVENTION

Accordingly, it is an object of the present invention to provide a novel method of a flip-chip bonding between a chip element and a wafer-board through solder bumps free from the above problems.

It is a further object of the present invention to provide a novel method of a flip-chip bonding between a chip element and a wafer-board through solder bumps for obtaining a high reliability of a packaged device.

It is a still further object of the present invention to provide a novel method of a flip-chip bonding between a chip element and a wafer-board through solder bumps for realizing a high productivity.

It is yet a further object of the present invention to provide a novel method of a flip-chip bonding between a chip element and a wafer-board through solder bumps at a low cost.

It is a further more object of the present invention to provide a novel method of a flip-chip bonding between a chip element and a wafer-board through solder bumps for allowing a reduction in manufacturing process time.

It is still more object of the present invention to provide a novel method of a flip-chip bonding between a chip element and a wafer-board through solder bumps for allowing a packaged optical device to have high characteristics and high performance.

It is moreover object of the present invention to provide a novel method of packaging chip elements onto a wafer-board free from the above problems.

It is another object of the present invention to provide a novel method of packaging chip elements onto a wafer-board for obtaining a high reliability of a packaged device.

It is still another object of the present invention to provide a novel method of packaging chip elements onto a wafer-board for realizing a high productivity.

It is yet another object of the present invention to provide a novel method of packaging chip elements onto a wafer-board at a low cost.

It is further another object of the present invention to provide a novel method of packaging chip elements onto a wafer-board for allowing a reduction in manufacturing process time.

It is an additional object of the present invention to provide a novel method of packaging chip elements onto a wafer-board for allowing a packaged optical device to have high characteristics and high performance.

A method of bonding a chip element to a wafer-board through at least a solder bump having a surface coated with an oxide layer placed between the chip element and the wafer-board is provided. The method comprises the following steps. The oxide layer coating the surface of the solder bump is exposed to a liquid. An energy is given to the solder bump both for melting the solder bump and for causing at least one of a convection and a cavitation of at least an adjacent part of the liquid to the oxide layer, so as to allow the at least one of the convection and the cavitation to remove the oxide layer from the surface of the solder bump, whereby the solder bump bonds the chip element and the wafer-board.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
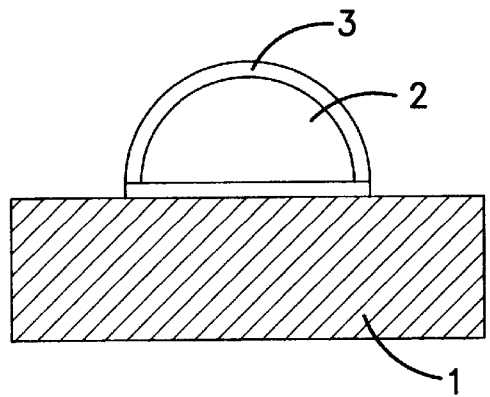
FIGS. 1A through 1D are fragmentary cross sectional elevation views illustrative of wafer-boards with solder bumps to be bonded with solder bonding pads on chip elements in sequential steps involved in a conventional flip-chip bonding method of bonding a chip element onto a wafer-board.
Figure 1B:
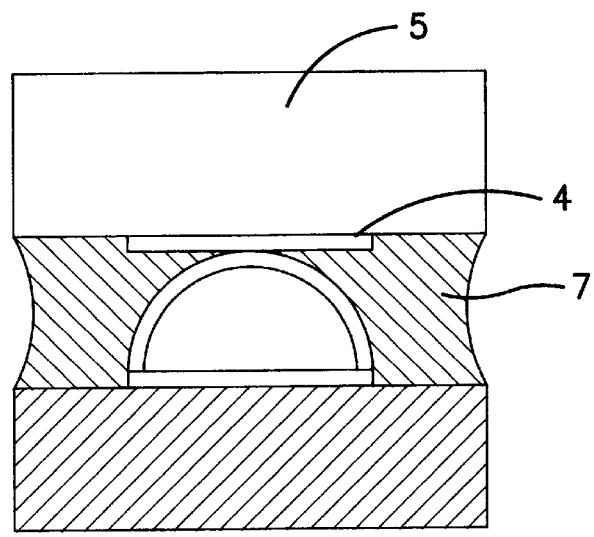
Figure 1C:
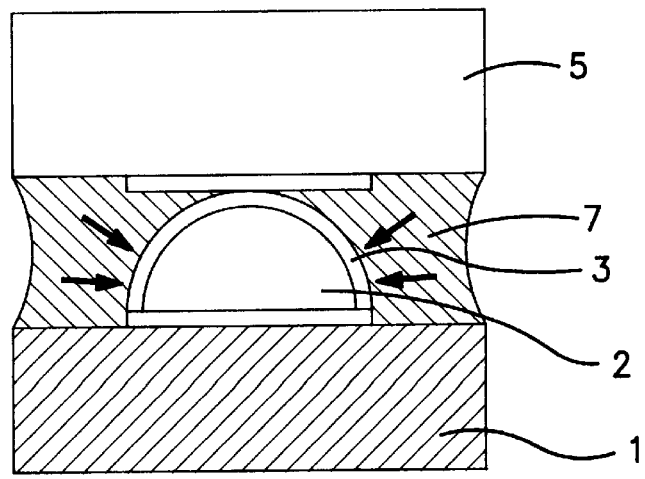
Figure 1D:
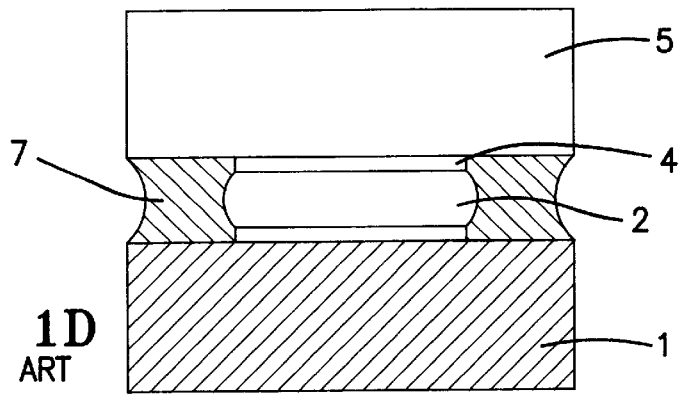

The first present invention provides a method of removing an oxide layer which coats a surface of a solder bump at the same time when the solder bump is melt for a flip-chip bonding between a chip element and a wafer-board through the solder bump. The method comprises the following steps. The oxide layer coating the surface of the solder bump between the chip element and the wafer-board is exposed to a liquid. At least one of a convection and a cavitation of at least an adjacent part of the liquid to the oxide layer is caused by giving an energy to the solder bump for melting the solder bump, so as to allow the at least one of the convection and the cavitation to remove the oxide layer from the surface of the solder bump.

It is preferable that the process of giving the energy to the solder bump comprises a heat treatment.

It is also preferable that the solder bump prior to the melting process is shaped to have two parallel and substantially flat surfaces which are in contact with bonding surfaces of the chip element and the wafer-board, whereby a reduction in height of the solder bump by melting the solder bump is suppressed.

It is further preferable that the solder bump is shaped by cutting out from a solder sheet.

It is also preferable that the liquid is chemically inactive.

It is further preferable that the liquid has no capability of oxidation and corrosion.

It is also preferable that the liquid has a boiling point which is not higher than a melting point of the solder bump.

It is further preferable that the liquid includes at least one selected from the group consisting of waxes, alkane system liquids and glycerins.

It is also preferable that the solder bump comprises at least one selected from the group consisting of AuSn-based solders, PbSn-based solders, AuSi-based solders, and In-based solders.

It is also preferable that the solder bump is bonded with a solder bonding pad provided on a bonding surface of the chip element.

It is further preferable that the solder bonding pad comprises an electrically conductive material which has a high resistivity to oxidation.

It is furthermore preferable that the electrically conductive material of the solder bonding pad comprises at least one selected from the group consisting of Au and Pt.

It is still further preferable that the solder bump has a larger size than the solder bonding pad in view of a plane parallel to the bonding surfaces of the chip element and the wafer-board.

It is also preferable that a gap between the chip element and the wafer-board is filled with the liquid so that the solder bump is immersed in the liquid in order to allow the solder bump melt to exhibit a surface tension to be applied to the chip element and the wafer-board in a direction parallel to bonding surfaces of the chip element and the wafer-board for causing a self-alignment between the chip element and the wafer-board.

In accordance with the first present invention, the solder bump receives the energy or the heat energy to be melt, however, in the liquid, whereby the liquid at least adjacent to the solder bump is also heated to cause a strong convection and/or a boiling. As the liquid is boiled, many bubbles are formed and then broken to form pressure waves. Namely, the cavitation appears. The pressure waves give the surface of the solder bump or the oxide layer a damage whereby the oxide layer is peeled and removed from the surface of the solder bump. The strong convection may also give the surface of the solder bump or the oxide layer a damage whereby the oxide layer is peeled and removed from the surface of the solder bump.

The liquid is preferably incapable of oxidation and corrosion. This allows a highly reliable bonding between the chip element and the wafer-board. Even if the chip element comprises the optical device, then since the liquid includes no solid component such as rosin included in the flux, no residue is adhered on the light emitting area of the optical device, whereby no deteriorations appear on the optical output characteristic and the photo-sensitivity.

Preferably, the solder bump is cut out from the solder sheet by punching with use of small punch and dies before the solder bump is attached on the solder bonding pad. This method allows the formation of the solder bump at low cost and in a short time as compared to when the solder bump is formed by a plating method or an evaporation method. If the solder bump made of an alloy is required, the alloy solder bump may be formed by punching the alloy sheet.

The above novel method is particularly effective when applying to the bonding between the optical device having at least an optical waveguide and a wafer-board also having at least an optical waveguide, wherein an optical axis of the optical waveguide of the optical device is required to accurately be aligned to the an optical axis of the optical waveguide of the wafer-board. The solder bump is melt to expand on an entire surface of the solder bonding pad and further exhibits a surface tension to be applied to the optical device and the wafer-board in a direction parallel to bonding surfaces of the optical device and the wafer-board for causing a highly accurate self-alignment between the optical device and the wafer-board, whereby the optical axes of the optical waveguides of the optical device and the wafer-board are accurately aligned to each other. If the solder bump comprises a ball bump, then such ball bump preferably has a certain height for facilitating a highly accurate self-alignment. If, however, the solder bump is shaped slender such as a rectangle, then such the slender solder bump has a lower height necessary for facilitating the highly accurate self-alignment as compared to the ball solder bump. The solder bump which is thin and flat is more preferable because of a smaller variation or error in height by melting the solder bump and bonding them by the solder bump.

Preferably, the solder bump has a larger size than the solder bonding pad on the chip element. In view of the self-alignment function, the small size of the solder bonding pad is likely to allow a highly accurate alignment of the bonding. It is in general required to provisionally place the chip element over the wafer-board at a high accuracy. Notwithstanding, in accordance with the present invention, it is available that when the chip element is provisionally placed on the wafer-board, at least a part of the solder bonding pad is made into contact with the solder bump. For this reason, the large size of the solder bump relax the required accuracy in alignment between the chip element and the wafer-board, thereby making it easy to package or bond the chip element to the wafer-board. Since the solder bonding pad has a small size, then the highly accurate alignment in bonding the chip element to the wafer-board is possible.

In the prior art, the size of the solder bump is required to be equal to or smaller than a half of the solder bonding pad.

In accordance with the present invention, however, the size of the solder bump may be larger than the solder bonding pad, whereby the required accuracy of alignment in provisionally placing the chip element on the wafer-board is relaxed into within the radius of the solder bump.

Preferably, the liquid has a boiling point which is lower than a melting point of the solder bump so that when the solder bump is melt, then the liquid is boiled to cause not only the strong convection but also the cavitation. The liquid may be selected from waxes, alkane system liquids and glycerins. The material of the solder bump may be selected from AuSn-based solders, PbSn-based solders, AuSi-based solders, In-based solders. The solder bonding pad may be made of Au or Pt which is resistive to oxidation so as to allow the solder bump melt to be applied on the surface of the solder bonding pad well.

The above first present invention provides the following five advantages.

First, since no flux is used, no component capable of oxidation and corrosion will reside, for which reason a good and a highly reliable flip-chip bonding can be realized.

Second, even if the chip element is an optical device, no residual flax is adhered on a light emitting area, for which reason no problem is raised with deterioration of output characteristics and photo-sensitivity.

Third, no further apparatus nor system such as supersonic vibrator is required and further solder bumps are cut out from a solder sheet to provide the solder bumps on the wafer board or the chip element, for which reason it is possible to reduce the cost of the flip-hip bonding.

Fourth, heating and melting the solder bump are concurrently carried out, for which reason it is possible to shorten the total time of the bonding processes.

Fifth, no highly accurate alignment is needed for provisionally placing the chip element over the wafer-board for subsequent bonding the chip element to the wafer-board through the solder bumps, for which reason the packaging is made easy and the productivity is improved.

The second present invention provides a method of bonding a chip element to a wafer-board through at least a solder bump having a surface coated with an oxide layer placed between the chip element and the wafer-board. The method comprises the following steps. The oxide layer coating the surface of the solder bump is exposed to a liquid. An energy is given to the solder bump both for melting the solder bump and for causing at least one of a convection and a cavitation of at least an adjacent part of the liquid to the oxide layer, so as to allow the at least one of the convection and the cavitation to remove the oxide layer from the surface of the solder bump, whereby the solder bump bonds the chip element and the wafer-board.

It is preferable that the process of giving the energy to the solder bump comprises a heat treatment.

It is also preferable that the solder bump prior to the melting process is shaped to have two parallel and substantially flat surfaces which are in contact with bonding surfaces of the chip element and the wafer-board, whereby a reduction in height of the solder bump by melting the solder bump is suppressed.

It is further preferable that the solder bump is shaped by cutting out from a solder sheet.

It is also preferable that the liquid is chemically inactive.

It is further preferable that the liquid has no capability of oxidation and corrosion.

It is also preferable that the liquid has a boiling point which is not higher than a melting point of the solder bump.

It is further preferable that the liquid includes at least one selected from the group consisting of waxes, alkane system liquids and glycerins.

It is also preferable that the solder bump comprises at least one selected from the group consisting of AuSn-based solders, PbSn-based solders, AuSi-based solders, and In-based solders.

It is also preferable that the solder bump is bonded with a solder bonding pad provided on a bonding surface of the chip element.

It is further preferable that the solder bonding pad comprises an electrically conductive material which has a high resistivity to oxidation.

It is further preferable that the electrically conductive material of the solder bonding pad comprises at least one selected from the group consisting of Au and Pt.

It is also preferable that the solder bump has a larger size than the solder bonding pad in view of a plane parallel to the bonding surfaces of the chip element and the wafer-board.

It is also preferable that a gap between the chip element and the wafer-board is filled with the liquid so that the solder bump is immersed in the liquid in order to allow the solder bump melt to exhibit a surface tension to be applied to the chip element and the wafer-board in a direction parallel to bonding surfaces of the chip element and the wafer-board for causing a self-alignment between the chip element and the wafer-board.

In accordance with the second present invention, the solder bump receives the energy or the heat energy to be melt, however, in the liquid, whereby the liquid at least adjacent to the solder bump is also heated to cause a strong convection and/or a boiling. As the liquid is boiled, many bubbles are formed and then broken to form pressure waves. Namely, the cavitation appears. The pressure waves give the surface of the solder bump or the oxide layer a damage whereby the oxide layer is peeled and removed from the surface of the solder bump. The strong convection may also give the surface of the solder bump or the oxide layer a damage whereby the oxide layer is peeled and removed from the surface of the solder bump.

The liquid is preferably incapable of oxidation and corrosion. This allows a highly reliable bonding between the chip element and the wafer-board. Even if the chip element comprises the optical device, then since the liquid includes no solid component such as rosin included in the flux, no residue is adhered on the light emitting area of the optical device, whereby no deteriorations appear on the optical output characteristic and the photo-sensitivity.

Preferably, the solder bump is cut out from the solder sheet by punching with use of small punch and dies before the solder bump is attached on the solder bonding pad. This method allows the formation of the solder bump at low cost and in a short time as compared to when the solder bump is formed by a plating method or an evaporation method. If the solder bump made of an alloy is required, the alloy solder bump may be formed by punching the alloy sheet.

The above novel method is particularly effective when applying to the bonding between the optical device having at least an optical waveguide and a wafer-board also having at least an optical waveguide, wherein an optical axis of the optical waveguide of the optical device is required to accurately be aligned to the an optical axis of the optical waveguide of the wafer-board. The solder bump is melt to expand on an entire surface of the solder bonding pad and further exhibits a surface tension to be applied to the optical device and the wafer-board in a direction parallel to bonding surfaces of the optical device and the wafer-board for causing a highly accurate self-alignment between the optical device and the wafer-board, whereby the optical axes of the optical waveguides of the optical device and the wafer-board are accurately aligned to each other. If the solder bump comprises a ball bump, then such ball bump preferably has a certain height for facilitating a highly accurate self-alignment. If, however, the solder bump is shaped slender such as a rectangle, then such the slender solder bump has a lower height necessary for facilitating the highly accurate self-alignment as compared to the ball solder bump. The solder bump which is thin and flat is more preferable because of a smaller variation or error in height by melting the solder bump and bonding them by the solder bump.

Preferably, the solder bump has a larger size than the solder bonding pad on the chip element. In view of the self-alignment function, the small size of the solder bonding pad is likely to allow a highly accurate alignment of the bonding. It is in general required to provisionally place the chip element over the wafer-board at a high accuracy. Notwithstanding, in accordance with the present invention, it is available that when the chip element is provisionally placed on the wafer-board, at least a part of the solder bonding pad is made into contact with the solder bump. For this reason, the large size of the solder bump relax the required accuracy in alignment between the chip element and the wafer-board, thereby making it easy to package or bond the chip element to the wafer-board. Since the solder bonding pad has a small size, then the highly accurate alignment in bonding the chip element to the wafer-board is possible.

In the prior art, the size of the solder bump is required to be equal to or smaller than a half of the solder bonding pad.

In accordance with the present invention, however, the size of the solder bump may be larger than the solder bonding pad, whereby the required accuracy of alignment in provisionally placing the chip element on the wafer-board is relaxed into within the radius of the solder bump.

Preferably, the liquid has a boiling point which is lower than a melting point of the solder bump so that when the solder bump is melt, then the liquid is boiled to cause not only the strong convection but also the cavitation. The liquid may be selected from waxes, alkane system liquids and glycerins. The material of the solder bump may be selected from AuSn-based solders, PbSn-based solders, AuSi-based solders, In-based solders. The solder bonding pad may be made of Au or Pt which is resistive to oxidation so as to allow the solder bump melt to be applied on the surface of the solder bonding pad well.

The above second present invention provides the following five advantages.

First, since no flux is used, no component capable of oxidation and corrosion will reside, for which reason a good and a highly reliable flip-chip bonding can be realized.

Second, even if the chip element is an optical device, no residual flax is adhered on a light emitting area, for which reason no problem is raised with deterioration of output characteristics and photo-sensitivity.

Third, no further apparatus nor system such as supersonic vibrator is required and further solder bumps are cut out from a solder sheet to provide the solder bumps on the wafer board or the chip element, for which reason it is possible to reduce the cost of the flip-hip bonding.

Fourth, heating and melting the solder bump are concurrently carried out, for which reason it is possible to shorten the total time of the bonding processes.

Fifth, no highly accurate alignment is needed for provisionally placing the chip element over the wafer-board for subsequent bonding the chip element to the wafer-board through the solder bumps, for which reason the packaging is made easy and the productivity is improved.

The third present invention provides a method of bonding between a chip element and a wafer-board through at least a solder bump having a surface coated with an oxide layer placed between the chip element and the wafer-board. The method comprises the following steps. A liquid chemically inactivate is supplied to a gap between the chip element and the wafer-board so as to immerse the oxide layer coating the surface of the solder bump into the liquid. The solder bump is subjected to a heat treatment both for melting the solder bump and for causing at least one of a convection and a cavitation of at least an adjacent part of the liquid to the oxide layer, so as to allow the at least one of the convection and the cavitation to remove the oxide layer from the surface of the solder bump, whereby the solder bump bonds the chip element and the wafer-board as well as the solder bump melt exhibits a surface tension to be applied to the chip element and the wafer-board in a direction parallel to bonding surfaces of the chip element and the wafer-board for causing a self-alignment between the chip element and the wafer-board.

It is preferable that the solder bump prior to the melting process is shaped to have two parallel and substantially flat surfaces which are in contact with bonding surfaces of the chip element and the wafer-board, whereby a reduction in height of the solder bump by melting the solder bump is suppressed.

It is further preferable that the solder bump is shaped by cutting out from a solder sheet.

It is also preferable that the liquid has no capability of oxidation and corrosion.

It is also preferable that the liquid has a boiling point which is not higher than a melting point of the solder bump.

It is further preferable that the liquid includes at least one selected from the group consisting of waxes, alkane system liquids and glycerins.

It is also preferable that the solder bump comprises at least one selected from the group consisting of AuSn-based solders, PbSn-based solders, AuSi-based solders, and In-based solders.

It is also preferable that the solder bump is bonded with a solder bonding pad provided on a bonding surface of the chip element.

It is further preferable that the solder bonding pad comprises an electrically conductive material which has a high resistivity to oxidation.

It is also preferable that the electrically conductive material of the solder bonding pad comprises at least one selected from the group consisting of Au and Pt.

It is also preferable that the solder bump has a larger size than the solder bonding pad in view of a plane parallel to the bonding surfaces of the chip element and the wafer-board.

In accordance with the third present invention, the solder bump receives the energy or the heat energy to be melt, however, in the liquid, whereby the liquid at least adjacent to the solder bump is also heated to cause a strong convection and/or a boiling. As the liquid is boiled, many bubbles are formed and then broken to form pressure waves. Namely, the cavitation appears. The pressure waves give the surface of the solder bump or the oxide layer a damage whereby the oxide layer is peeled and removed from the surface of the solder bump. The strong convection may also give the surface of the solder bump or the oxide layer a damage whereby the oxide layer is peeled and removed from the surface of the solder bump.

The liquid is preferably incapable of oxidation and corrosion. This allows a highly reliable bonding between the chip element and the wafer-board. Even if the chip element comprises the optical device, then since the liquid includes no solid component such as rosin included in the flux, no residue is adhered on the light emitting area of the optical device, whereby no deteriorations appear on the optical output characteristic and the photo-sensitivity.

Preferably, the solder bump is cut out from the solder sheet by punching with use of small punch and dies before the solder bump is attached on the solder bonding pad. This method allows the formation of the solder bump at low cost and in a short time as compared to when the solder bump is formed by a plating method or an evaporation method. If the solder bump made of an alloy is required, the alloy solder bump may be formed by punching the alloy sheet.

The above novel method is particularly effective when applying to the bonding between the optical device having at least an optical waveguide and a wafer-board also having at least an optical waveguide, wherein an optical axis of the optical waveguide of the optical device is required to accurately be aligned to the an optical axis of the optical waveguide of the wafer-board. The solder bump is melt to expand on an entire surface of the solder bonding pad and further exhibits a surface tension to be applied to the optical device and the wafer-board in a direction parallel to bonding surfaces of the optical device and the wafer-board for causing a highly accurate self-alignment between the optical device and the wafer-board, whereby the optical axes of the optical waveguides of the optical device and the wafer-board are accurately aligned to each other. If the solder bump comprises a ball bump, then such ball bump preferably has a certain height for facilitating a highly accurate self-alignment. If, however, the solder bump is shaped slender such as a rectangle, then such the slender solder bump has a lower height necessary for facilitating the highly accurate self-alignment as compared to the ball solder bump. The solder bump which is thin and flat is more preferable because of a smaller variation or error in height by melting the solder bump and bonding them by the solder bump.

Preferably, the solder bump has a larger size than the solder bonding pad on the chip element. In view of the self-alignment function, the small size of the solder bonding pad is likely to allow a highly accurate alignment of the bonding. It is in general required to provisionally place the chip element over the wafer-board at a high accuracy. Notwithstanding, in accordance with the present invention, it is available that when the chip element is provisionally placed on the wafer-board, at least a part of the solder bonding pad is made into contact with the solder bump. For this reason, the large size of the solder bump relax the required accuracy in alignment between the chip element and the wafer-board, thereby making it easy to package or bond the chip element to the wafer-board. Since the solder bonding pad has a small size, then the highly accurate alignment in bonding the chip element to the wafer-board is possible.

In the prior art, the size of the solder bump is required to be equal to or smaller than a half of the solder bonding pad.

In accordance with the present invention, however, the size of the solder bump may be larger than the solder bonding pad, whereby the required accuracy of alignment in provisionally placing the chip element on the wafer-board is relaxed into within the radius of the solder bump.

Preferably, the liquid has a boiling point which is lower than a melting point of the solder bump so that when the solder bump is melt, then the liquid is boiled to cause not only the strong convection but also the cavitation. The liquid may be selected from waxes, alkane system liquids and glycerins The material of the solder bump may be selected from AuSn-based solders, PbSn-based solders, AuSi-based solders, In-based solders. The solder bonding pad may be made of Au or Pt which is resistive to oxidation so as to allow the solder bump melt to be applied on the surface of the solder bonding pad well.

The above third present invention provides the following five advantages.

First, since no flux is used, no component capable of oxidation and corrosion will reside, for which reason a good and a highly reliable flip-chip bonding can be realized.

Second, even if the chip element is an optical device, no residual flax is adhered on a light emitting area, for which reason no problem is raised with deterioration of output characteristics and photo-sensitivity.

Third, no further apparatus nor system such as supersonic vibrator is required and further solder bumps are cut out from a solder sheet to provide the solder bumps on the wafer board or the chip element, for which reason it is possible to reduce the cost of the flip-hip bonding.

Fourth, heating and melting the solder bump are concurrently carried out, for which reason it is possible to shorten the total time of the bonding processes.

Fifth, no highly accurate alignment is needed for provisionally placing the chip element over the wafer-board for subsequent bonding the chip element to the wafer-board through the solder bumps, for which reason the packaging is made easy and the productivity is improved.

The fourth present invention provides a method of a flip-chip bonding between a chip element and a wafer-board through at least a solder bump having a surface coated with an oxide layer placed between a corresponding solder bonding pad provided on a bonding surface of the chip element and a bonding surface of the wafer-board. The method comprises the following steps. On the bonding surface of the wafer-board, there is provided the solder bump which is shaped to have two parallel and substantially flat surfaces and which has a larger size than the solder bonding pad in view of a plane parallel to the bonding surfaces of the chip element and the wafer-board. A chemically inactivate liquid having no capability of oxidation and corrosion and having a boiling point not higher than a melting point of the solder bump is supplied into a gap between the chip element and the wafer-board so as to immerse the oxide layer coating the surface of the solder bump into the liquid. The solder bump is subjected to a heat treatment both for melting the solder bump and for causing both a convection and a cavitation of at least an adjacent part of the liquid to the oxide layer, so as to allow both the convection and the cavitation to remove the oxide layer from the surface of the solder bump, whereby the solder bump bonds the chip element and the wafer-board as well as the solder bump melt exhibits a surface tension to be applied to the chip element and the wafer-board in a direction parallel to bonding surfaces of the chip element and the wafer-board for causing a self-alignment between the chip element and the wafer-board.

It is preferable that the solder bump is shaped by cutting out from a solder sheet.

It is also preferable that the liquid includes at least one selected from the group consisting of waxes, alkane system liquids and glycerins.

It is also preferable that the solder bump comprises at least one selected from the group consisting of AuSn-based solders, PbSn-based solders, AuSi-based solders, and In-based solders.

It is also preferable that the solder bonding pad comprises an electrically conductive material which is highly resistive to oxidation.

It is further preferable that the electrically conductive material of the solder bonding pad comprises at least one selected from the group consisting of Au and Pt.

In accordance with the fourth present invention, the solder bump receives the energy or the heat energy to be melt, however, in the liquid, whereby the liquid at least adjacent to the solder bump is also heated to cause a strong convection and/or a boiling. As the liquid is boiled, many bubbles are formed and then broken to form pressure waves. Namely, the cavitation appears. The pressure waves give the surface of the solder bump or the oxide layer a damage whereby the oxide layer is peeled and removed from the surface of the solder bump. The strong convection may also give the surface of the solder bump or the oxide layer a damage whereby the oxide layer is peeled and removed from the surface of the solder bump.

The liquid is preferably incapable of oxidation and corrosion. This allows a highly reliable bonding between the chip element and the wafer-board. Even if the chip element comprises the optical device, then since the liquid includes no solid component such as rosin included in the flux, no residue is adhered on the light emitting area of the optical device, whereby no deteriorations appear on the optical output characteristic and the photo-sensitivity.

Preferably, the solder bump is cut out from the solder sheet by punching with use of small punch and dies before the solder bump is attached on the solder bonding pad. This method allows the formation of the solder bump at low cost and in a short time as compared to when the solder bump is formed by a plating method or an evaporation method. If the solder bump made of an alloy is required, the alloy solder bump may be formed by punching the alloy sheet.

The above novel method is particularly effective when applying to the bonding between the optical device having at least an optical waveguide and a wafer-board also having at least an optical waveguide, wherein an optical axis of the optical waveguide of the optical device is required to accurately be aligned to the an optical axis of the optical waveguide of the wafer-board. The solder bump is melt to expand on an entire surface of the solder bonding pad and further exhibits a surface tension to be applied to the optical device and the wafer-board in a direction parallel to bonding surfaces of the optical device and the wafer-board for causing a highly accurate self-alignment between the optical device and the wafer-board, whereby the optical axes of the optical waveguides of the optical device and the wafer-board are accurately aligned to each other. If the solder bump comprises a ball bump, then such ball bump preferably has a certain height for facilitating a highly accurate self-alignment. If, however, the solder bump is shaped slender such as a rectangle, then such the slender solder bump has a lower height necessary for facilitating the highly accurate self-alignment as compared to the ball solder bump. The solder bump which is thin and flat is more preferable because of a smaller variation or error in height by melting the solder bump and bonding them by the solder bump.

Preferably, the solder bump has a larger size than the solder bonding pad on the chip element. In view of the self-alignment function, the small size of the solder bonding pad is likely to allow a highly accurate alignment of the bonding. It is in general required to provisionally place the chip element over the wafer-board at a high accuracy. Notwithstanding, in accordance with the present invention, it is available that when the chip element is provisionally placed on the wafer-board, at least a part of the solder bonding pad is made into contact with the solder bump. For this reason, the large size of the solder bump relax the required accuracy in alignment between the chip element and the wafer-board, thereby making it easy to package or bond the chip element to the wafer-board. Since the solder bonding pad has a small size, then the highly accurate alignment in bonding the chip element to the wafer-board is possible.

In the prior art, the size of the solder bump is required to be equal to or smaller than a half of the solder bonding pad.

In accordance with the present invention, however, the size of the solder bump may be larger than the solder bonding pad, whereby the required accuracy of alignment in provisionally placing the chip element on the wafer-board is relaxed into within the radius of the solder bump.

Preferably, the liquid has a boiling point which is lower than a melting point of the solder bump so that when the solder bump is melt, then the liquid is boiled to cause not only the strong convection but also the cavitation. The liquid may be selected from waxes, alkane system liquids and glycerins. The material of the solder bump may be selected from AuSn-based solders, PbSn-based solders, AuSi-based solders, In-based solders. The solder bonding pad may be made of Au or Pt which is resistive to oxidation so as to allow the solder bump melt to be applied on the surface of the solder bonding pad well.

The above fourth present invention provides the following five advantages.

First, since no flux is used, no component capable of oxidation and corrosion will reside, for which reason a good and a highly reliable flip-chip bonding can be realized.

Second, even if the chip element is an optical device, no residual flax is adhered on a light emitting area, for which reason no problem is raised with deterioration of output characteristics and photo-sensitivity.

Third, no further apparatus nor system such as supersonic vibrator is required and further solder bumps are cut out from a solder sheet to provide the solder bumps on the wafer board or the chip element, for which reason it is possible to reduce the cost of the flip-hip bonding.

Fourth, heating and melting the solder bump are concurrently carried out, for which reason it is possible to shorten the total time of the bonding processes.

Fifth, no highly accurate alignment is needed for provisionally placing the chip element over the wafer-board for subsequent bonding the chip element to the wafer-board through the solder bumps, for which reason the packaging is made easy and the productivity is improved.

The fifth present invention provides a method of a flip-chip bonding between a chip element and a wafer-board through at least a solder bump having a surface coated with an oxide layer placed between a corresponding solder bonding pad provided on a bonding surface of the chip element and a bonding surface of the wafer-board. The method comprises the following steps. On the solder bonding pad, there is provided the solder bump which is shaped to have two parallel and substantially flat surfaces and which has a larger size than the solder bonding pad in view of a plane parallel to the bonding surfaces of the chip element and the wafer-board. A chemically inactivate liquid having no capability of oxidation and corrosion and having a boiling point not higher than a melting point of the solder bump is supplied into a gap between the chip element and the wafer-board so as to immerse the oxide layer coating the surface of the solder bump into the liquid. The solder bump is subjected to a heat treatment both for melting the solder bump and for causing both a convection and a cavitation of at least an adjacent part of the liquid to the oxide layer, so as to allow both the convection and the cavitation to remove the oxide layer from the surface of the solder bump, whereby the solder bump bonds the chip element and the wafer-board as well as the solder bump melt exhibits a surface tension to be applied to the chip element and the wafer-board in a direction parallel to bonding surfaces of the chip element and the wafer-board for causing a self-alignment between the chip element and the wafer-board.

It is preferable that the solder bump is shaped by cutting out from a solder sheet.

It is also preferable that the liquid includes at least one selected from the group consisting of waxes, alkane system liquids and glycerins.

It is also preferable that the solder bump comprises at least one selected from the group consisting of AuSn-based solders, PbSn-based solders, AuSi-based solders, and In-based solders.

It is also preferable that the solder bonding pad comprises an electrically conductive material which is highly resistive to oxidation.

It is further preferable that the electrically conductive material of the solder bonding pad comprises at least one selected from the group consisting of Au and Pt.

In accordance with the fifth present invention, the solder bump receives the energy or the heat energy to be melt, however, in the liquid, whereby the liquid at least adjacent to the solder bump is also heated to cause a strong convection and/or a boiling. As the liquid is boiled, many bubbles are formed and then broken to form pressure waves. Namely, the cavitation appears. The pressure waves give the surface of the solder bump or the oxide layer a damage whereby the oxide layer is peeled and removed from the surface of the solder bump. The strong convection may also give the surface of the solder bump or the oxide layer a damage whereby the oxide layer is peeled and removed from the surface of the solder bump.

The liquid is preferably incapable of oxidation and corrosion. This allows a highly reliable bonding between the chip element and the wafer-board. Even if the chip element comprises the optical device, then since the liquid includes no solid component such as rosin included in the flux, no residue is adhered on the light emitting area of the optical device, whereby no deteriorations appear on the optical output characteristic and the photo-sensitivity.

Preferably, the solder bump is cut out from the solder sheet by punching with use of small punch and dies before the solder bump is attached on the solder bonding pad. This method allows the formation of the solder bump at low cost and in a short time as compared to when the solder bump is formed by a plating method or an evaporation method. If the solder bump made of an alloy is required, the alloy solder bump may be formed by punching the alloy sheet.

The above novel method is particularly effective when applying to the bonding between the optical device having at least an optical waveguide and a wafer-board also having at least an optical waveguide, wherein an optical axis of the optical waveguide of the optical device is required to accurately be aligned to the an optical axis of the optical waveguide of the wafer-board. The solder bump is melt to expand on an entire surface of the solder bonding pad and further exhibits a surface tension to be applied to the optical device and the wafer-board in a direction parallel to bonding surfaces of the optical device and the wafer-board for causing a highly accurate self-alignment between the optical device and the wafer-board, whereby the optical axes of the optical waveguides of the optical device and the wafer-board are accurately aligned to each other. If the solder bump comprises a ball bump, then such ball bump preferably has a certain height for facilitating a highly accurate self-alignment. If, however, the solder bump is shaped slender such as a rectangle, then such the slender solder bump has a lower height necessary for facilitating the highly accurate self-alignment as compared to the ball solder bump. The solder bump which is thin and flat is more preferable because of a smaller variation or error in height by melting the solder bump and bonding them by the solder bump.

Preferably, the solder bump has a larger size than the solder bonding pad on the chip element. In view of the self-alignment function, the small size of the solder bonding pad is likely to allow a highly accurate alignment of the bonding. It is in general required to provisionally place the chip element over the wafer-board at a high accuracy. Notwithstanding, in accordance with the present invention, it is available that when the chip element is provisionally placed on the wafer-board, at least a part of the solder bonding pad is made into contact with the solder bump. For this reason, the large size of the solder bump relax the required accuracy in alignment between the chip element and the wafer-board, thereby making it easy to package or bond the chip element to the wafer-board. Since the solder bonding pad has a small size, then the highly accurate alignment in bonding the chip element to the wafer-board is possible.

In the prior art, the size of the solder bump is required to be equal to or smaller than a half of the solder bonding pad.

In accordance with the present invention, however, the size of the solder bump may be larger than the solder bonding pad, whereby the required accuracy of alignment in provisionally placing the chip element on the wafer-board is relaxed into within the radius of the solder bump.

Preferably, the liquid has a boiling point which is lower than a melting point of the solder bump so that when the solder bump is melt, then the liquid is boiled to cause not only the strong convection but also the cavitation. The liquid may be selected from waxes, alkane system liquids and glycerins The material of the solder bump may be selected from AuSn-based solders, PbSn-based solders, AuSi-based solders, In-based solders. The solder bonding pad may be made of Au or Pt which is resistive to oxidation so as to allow the solder bump melt to be applied on the surface of the solder bonding pad well.

The above fifth present invention provides the following five advantages.

First, since no flux is used, no component capable of oxidation and corrosion will reside, for which reason a good and a highly reliable flip-chip bonding can be realized.

Second, even if the chip element is an optical device, no residual flax is adhered on a light emitting area, for which reason no problem is raised with deterioration of output characteristics and photo-sensitivity.

Third, no further apparatus nor system such as supersonic vibrator is required and further solder bumps are cut out from a solder sheet to provide the solder bumps on the wafer board or the chip element, for which reason it is possible to reduce the cost of the flip-hip bonding.

Fourth, heating and melting the solder bump are concurrently carried out, for which reason it is possible to shorten the total time of the bonding processes.

Fifth, no highly accurate alignment is needed for provisionally placing the chip element over the wafer-board for subsequent bonding the chip element to the wafer-board through the solder bumps, for which reason the packaging is made easy and the productivity is improved.

PREFERRED EMBODIMENTS

Figure 2A:
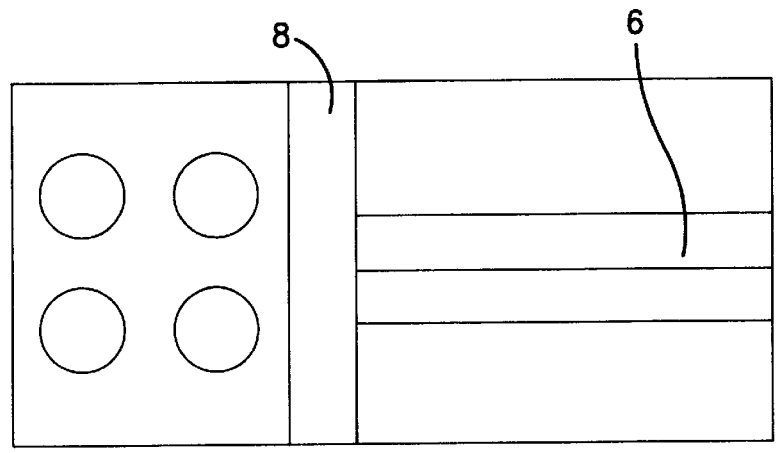
FIG. 2A is a plane view illustrative of solder bumps on solder bonding pads provided on a silicon wafer-board in a process of forming AuSn amorphous alloy solder bumps on the solder bonding pads provided on the silicon wafer-board in a first embodiment in accordance with the present invention.
Figure 2B:
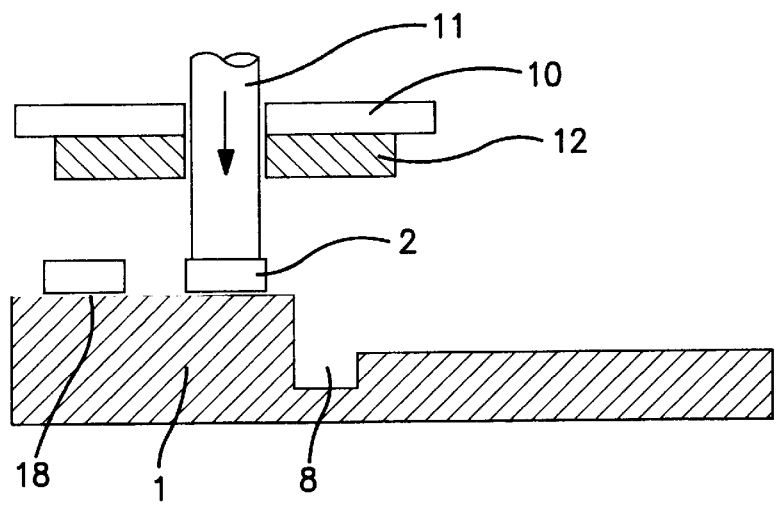
FIG. 2B is a cross sectional elevation view illustrative of solder bumps on solder bonding pads provided on a silicon wafer-board in a process of forming AuSn amorphous alloy solder bumps on the solder bonding pads provided on the silicon wafer-board in a first embodiment in accordance with the present invention.
Figure 3A:
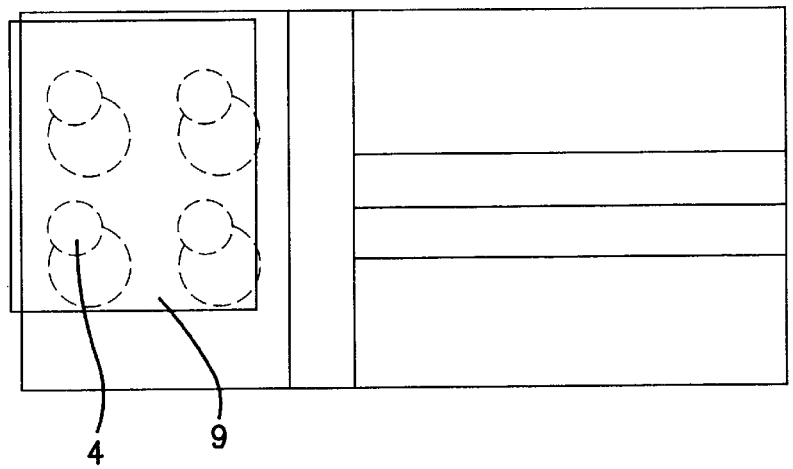
FIG. 3A is a plane view illustrative of a semiconductor laser device provisionally placed on the AuSn amorphous alloy solder bumps on the solder bonding pads provided on the silicon wafer-board in a process of provisionally placing the semiconductor laser device onto the AuSn amorphous alloy solder bumps on the solder bonding pads provided on the silicon wafer-board in a first embodiment in accordance with the present invention.
Figure 3B:
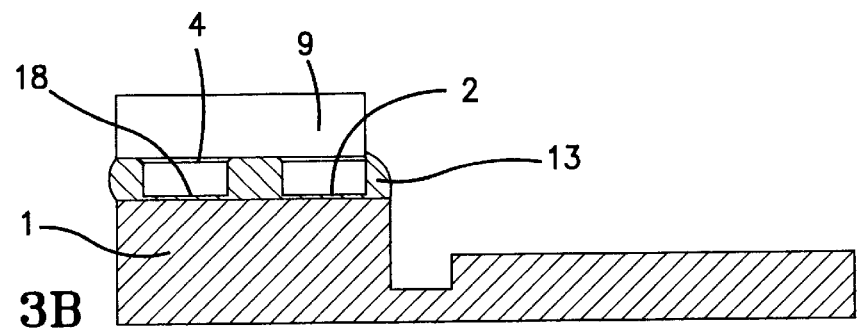
FIG. 3B is a cross sectional elevation view illustrative of a semiconductor laser device provisionally placed on the AuSn amorphous alloy solder bumps on the solder bonding pads provided on the silicon wafer-board in a process of provisionally placing the semiconductor laser device onto the AuSn amorphous alloy solder bumps on the solder bonding pads provided on the silicon wafer-board in a first embodiment in accordance with the present invention.
Figure 5A:
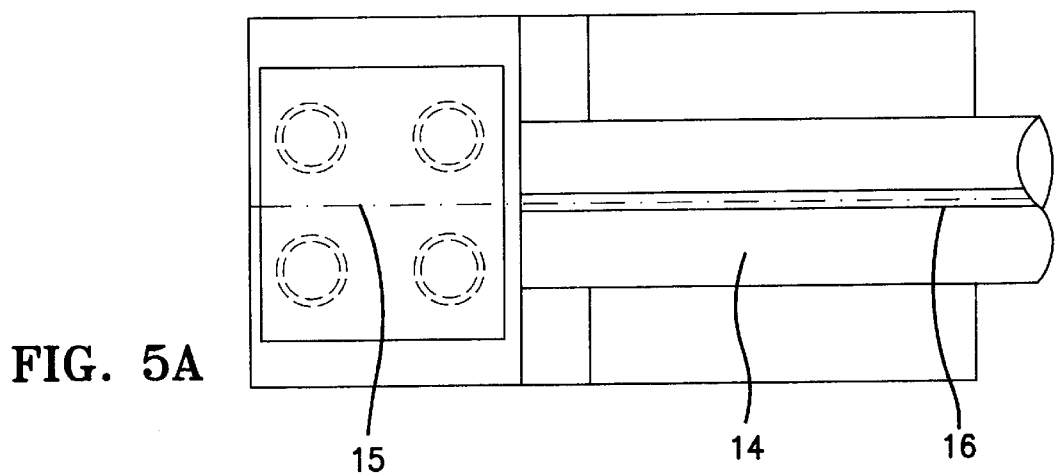
FIG. 5A is a fragmentary plane view illustrative of an optical fiber aligned to the semiconductor laser device over the silicon wafer-board in a process of alignment to the semiconductor laser device in a first embodiment in accordance with the present invention.
Figure 4:
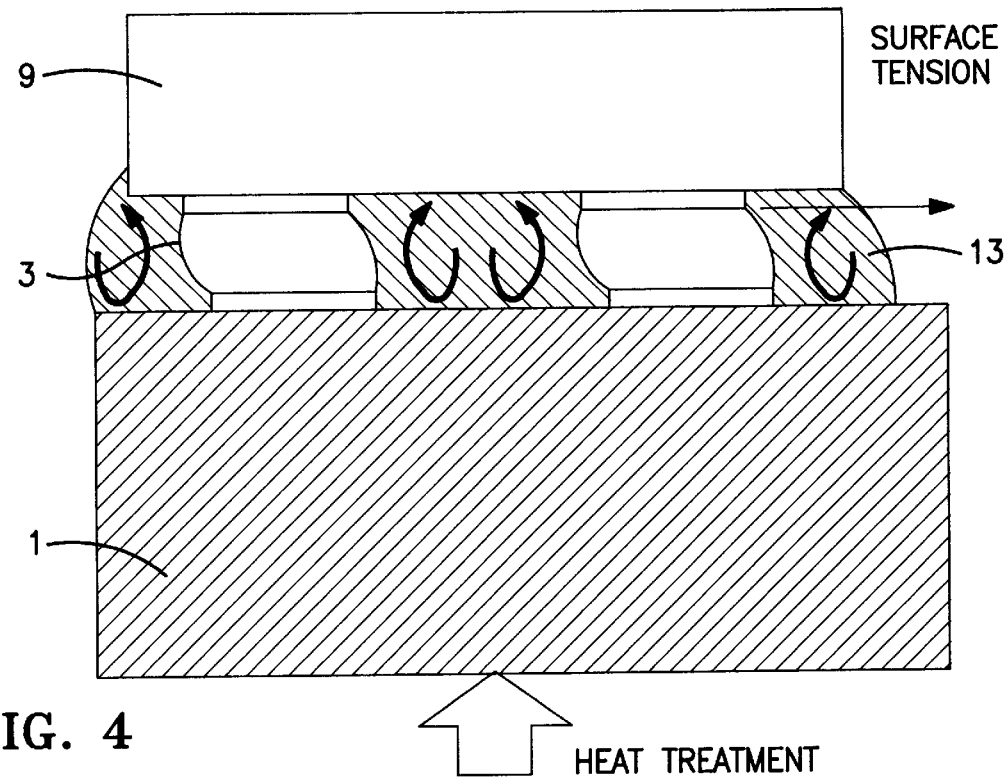
FIG. 4 is a fragmentary cross sectional elevation view illustrative of the semiconductor laser device bonded through the AuSn amorphous alloy solder bumps to the solder bonding pads provided on the silicon wafer-board in a process of heat treatment to melt the solder bump and cause convection and cavitation of a chemically inactive liquid in a first embodiment in accordance with the present invention.
Figure 5B:
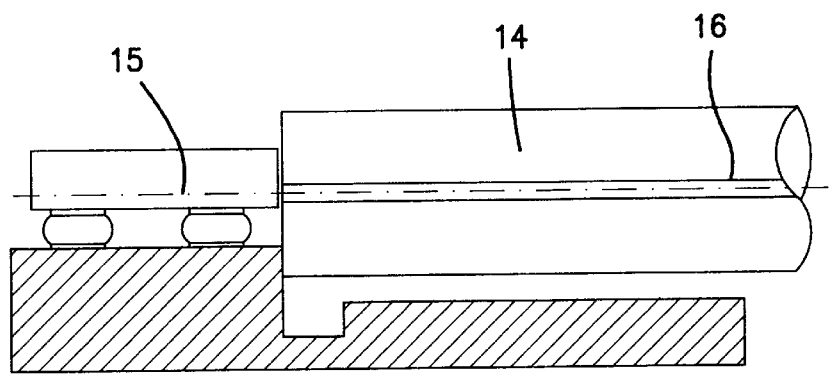
FIG. 5B is a fragmentary cross sectional elevation view illustrative of an optical fiber aligned to the semiconductor laser device over the silicon wafer-board in a process of alignment to the semiconductor laser device in a first embodiment in accordance with the present invention.

First Embodiment:

A first embodiment according to the present invention will be described in detail with reference to FIGS. 2A, 2B, 3A, 3B, 4, 5A and 5B wherein a novel method of bonding a semiconductor laser device onto a silicon wafer-board through AuSn amorphous alloy solder bumps is provided. FIG. 2A is a plane view illustrative of solder bumps on solder bonding pads provided on a silicon wafer-board in a process of forming AuSn amorphous alloy solder bumps on the solder bonding pads provided on the silicon wafer-board. FIG. 2B is a cross sectional elevation view illustrative of solder bumps on solder bonding pads provided on a silicon wafer-board in a process of forming AuSn amorphous alloy solder bumps on the solder bonding pads provided on the silicon wafer-board. FIG. 3A is a plane view illustrative of a semiconductor laser device provisionally placed on the AuSn amorphous alloy solder bumps on the solder bonding pads provided on the silicon wafer-board in a process of provisionally placing the semiconductor laser device onto the AuSn amorphous alloy solder bumps on the solder bonding pads provided on the silicon wafer-board. FIG. 3B is a cross sectional elevation view illustrative of a semiconductor laser device provisionally placed on the AuSn amorphous alloy solder bumps on the solder bonding pads provided on the silicon wafer-board in a process of provisionally placing the semiconductor laser device onto the AuSn amorphous alloy solder bumps on the solder bonding pads provided on the silicon wafer-board. FIG. 4 is a fragmentary cross sectional elevation view illustrative of the semiconductor laser device bonded through the AuSn amorphous alloy solder bumps to the solder bonding pads provided on the silicon wafer-board in a process of heat treatment to melt the solder bump and cause convection and cavitation of a chemically inactive liquid. FIG. 5A is a fragmentary plane view illustrative of an optical fiber aligned to the semiconductor laser device over the silicon wafer-board in a process of alignment to the semiconductor laser device. FIG. 5B is a fragmentary cross sectional elevation view illustrative of an optical fiber aligned to the semiconductor laser device over the silicon wafer-board in a process of alignment to the semiconductor laser device.

With reference to FIG. 2A, a V-shaped groove 6 is selectively formed in a silicon wafer-board 1 by a photolithography and subsequent an anisotropic etching using KOH. Further, solder bonding pads 18 are also formed on a top surface of the silicon wafer-board 1. An accuracy of relative position between the solder bonding pads 18 and the V-shaped groove 6 is limited by an accuracy in alignment of mask in the photolithography process. Furthermore, a trench groove 8 is also selectively formed by a cutting process so that the trench groove 8 extends perpendicular to the V-shaped groove 6 and the trench groove 8 isolates the surface region of the silicon wafer-board 1 into first and second regions, wherein the solder bonding pads 18 are formed on the first region whilst the V-shaped groove 6 extends on the second region.

With reference to FIG. 2B, an AuSn amorphous alloy solder sheet 10 is prepared and set over the silicon wafer-board 1. By use of small size punch 11 and dies 12, the AuSn amorphous alloy solder sheet 10 is punched to cut out AuSn amorphous alloy solder bumps 2 from the AuSn amorphous alloy solder sheet 10 before thermocompression bondings of the AuSn amorphous alloy solder bumps 2 onto the solder bonding pads are carried out. The thermocompression bonding may be carried out by use of the conventional techniques disclosed, for example, in Japanese laid-open patent publications Nos. 4-65847 and 4-152682.

With reference to FIGS. 3A and 3B, a chemically inactive liquid 13 is dropped over the AuSn amorphous alloy solder bumps 2 so that each of the AuSn amorphous alloy solder bumps 2 is immersed into the dropped chemically inactive liquid 13, wherein a surface of each of the AuSn amorphous alloy solder bumps 2 is coated with an oxide layer even not illustrated. The liquid 13 has a boiling point lower than a melting point of the AuSn amorphous alloy of the AuSn amorphous alloy solder bumps 2. The liquid may, for example, be a wax. A semiconductor laser device 9 as a chip element is provided with solder bonding pads 4 at corresponding positions to the positions where the AuSn amorphous alloy solder bumps 2 are formed. The semiconductor laser device 9 is provisionally placed on the silicon wafer-board 1 so that the AuSn amorphous alloy solder bumps 2 are aligned to the corresponding solder bonding pads 4, whereby the AuSn amorphous alloy solder bumps 2 are made into contact with the corresponding solder bonding pads 4. A gap between the semiconductor laser device 9 and the silicon wafer-board 1 is filled with the chemically inactive liquid.

With reference to FIG. 4, a heat treatment is carried out, for example, by use of a reflow furnace so that the solder bump 2 receives an energy or a heat energy and is melt, whereby the liquid 13 is also heated to cause a strong convection and a boiling. As the liquid is boiled, many bubbles are formed and then broken thereby to form pressure waves. Namely, the cavitation appears. The pressure waves give the surface of the solder bump 2 or the oxide layer 3 a damage whereby the oxide layer 3 is peeled and removed from the surface of the solder bump 2. The strong convection may also give the surface of the solder bump 2 or the oxide layer 3 a damage whereby the oxide layer 3 is peeled and removed from the surface of the solder bump.

Further, the solder bump 2 having been melt expands on an entire surface of the solder bonding pads 4 and 18 and exhibits a surface tension to be applied to the semiconductor laser device 9 and the silicon wafer-board 1 in a direction parallel to bonding surfaces of the semiconductor laser device 9 and the silicon wafer-board 1 for realizing a highly accurate self-alignment between the semiconductor laser device 9 and the silicon wafer-board 1.

With reference to FIGS. 5A and 5B, an optical fiber 14 is aligned to the semiconductor laser device 9 by use of the V-shaped groove 6 and the trench groove 8. Then, the optical fiber 14 is fixed to the silicon wafer-board 1 by an adhesive. The edge of the optical fiber 14 is made into securely contact with the vertical side wall of the trench groove 8 whereby an optical axis 15 of the semiconductor laser device 9 is aligned at a high accuracy to a single core 16 of the optical fiber 14.

In the above novel method, each of the solder bonding pads 18 may comprise multi-layer structure of Ti-Pt-Au layers, wherein the Ti layer is adjacent to the silicon wafer-board. Each of the solder bonding pads 18 and 4 provided on the semiconductor laser device 9 and the silicon wafer-board 1 respectively is cylindrically shaped to have a diameter of 50 micrometers and a thickness of 0.7 micrometers. A total height of the solder bump 2 and the solder bonding pads 18 and 4 after bonding process is 40 micrometers.

The above heat treatment may be carried out at a temperature of 300° C. for causing the solder bumps 2 to be melt and also causing the strong convection and cavitation of the chemically inactive liquid.

The AuSn amorphous alloy solder sheet 10 may have a thickness of 30 micrometers. The punch 11 may have a diameter of 90 micrometers. The AuSn amorphous alloy solder sheet 10 is heated at a temperature of 180° C. whilst the silicon wafer-board 1 is also heated at a temperature of 150° C. for subsequent punching process to cut out the AuSn amorphous alloy solder bumps 2 from the AuSn amorphous alloy solder sheet 10.

The core 16 of the optical fiber 14 is leveled higher by 44 micrometers than the surface of the first region of the silicon wafer-board 1.

The V-shaped groove 6 may be shaped that each of sloped faces consisting the V-valley has an angle of 54.7 degrees to the flat surface of the silicon wafer-board 1 and a width of the V-shaped groove 6 is 96 micrometers.

The optical fiber 14 may have a diameter of 125 micrometers. The chemically inactive liquid 13 having the lower boiling point than the melting point of the solder bump material may comprise a wax.

As modification to this embodiment, instead of AuSn, PbSn-based materials, AuSi-based materials and In-based materials are, for example, available.

In place of the semiconductor laser device, any other optical devices such as a semiconductor light amplifier optical waveguide photodetector and a semiconductor optical modulator are also available.

As a non-solder-bonding metal film, a silicon dioxide layer, a silicon nitride layer and a resin layer are available provided that the film has a good adhesion with the solder bonding pad and has incapability of allowing an application of the solder material.

As the optical waveguide, optical dividers, optical couplers and an optical switches are also available. The optical device, the optical waveguide and the optical fiber may have a single or multiple cores. It is also available to provide a spot-size converter at a light emitting portion or a light receiving portion of the optical device. Normally, coupling between the optical device such as the semiconductor laser and the optical waveguide is engaged with the problem with the coupling loss die to non-correspondence or difference in mode field between the optical device and the optical waveguide. The spot-size converter reduces the degree of the non-correspondence or difference to provide a high coupling efficiency. If no spot size converter is provided, it is preferable to provide an optical lens an edge of the optical fiber or the optical waveguide so as to reduce a difference in mode field between the optical device and the optical waveguide, thereby obtaining a highly efficient coupling.

Further, it is also possible to provide the spot-size converter between the optical device and the optical waveguide. The spot-size converter reduces the degree of the non-correspondence or difference to provide a high coupling efficiency.

The above chemically inactive liquid may also comprise other liquids than the wax, provided that the liquids are free of the problem with the residue and also incapable of oxidation or corrosion. For example, alkane system liquids such as heptane and octane as well as glycerins are also available.

As a furthermore modification to this embodiment, it is available to provide the solder bumps on the solder bonding pads provided on the chip element before the bonding process.

Figure 8:
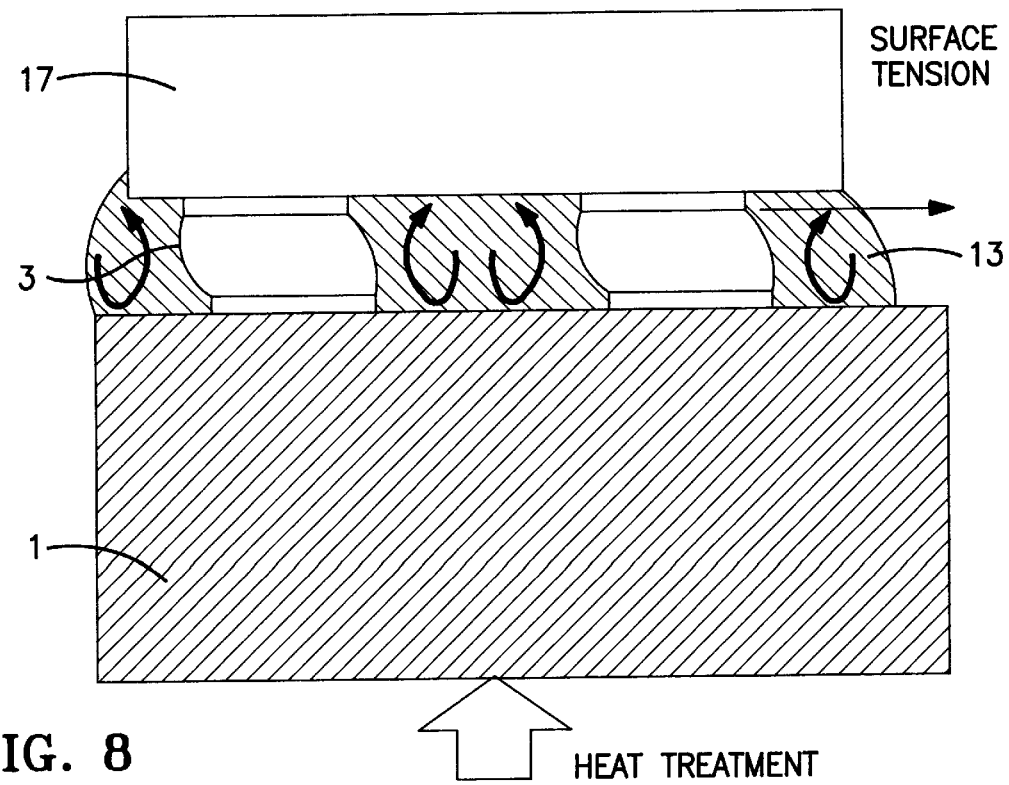
FIG. 8 is a fragmentary cross sectional elevation view illustrative of the semiconductor photodetector bonded through the AuSn amorphous alloy solder bumps to the solder bonding pads provided on the silicon wafer-board in a process of heat treatment to melt the solder bump and cause convection and cavitation of a chemically inactive liquid in a second embodiment in accordance with the present invention.
Figure 6A:
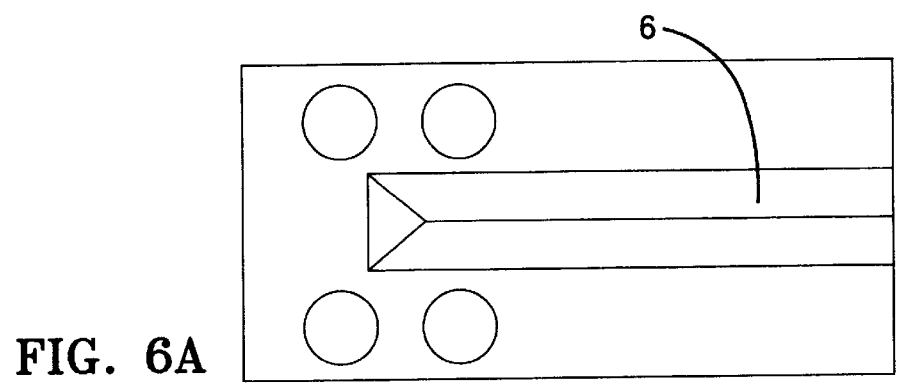
FIG. 6A is a plane view illustrative of solder bumps on solder bonding pads provided on a silicon wafer-board in a process of forming AuSn amorphous alloy solder bumps on the solder bonding pads provided on the silicon wafer-board in a second embodiment in accordance with the present invention.
Figure 6B:
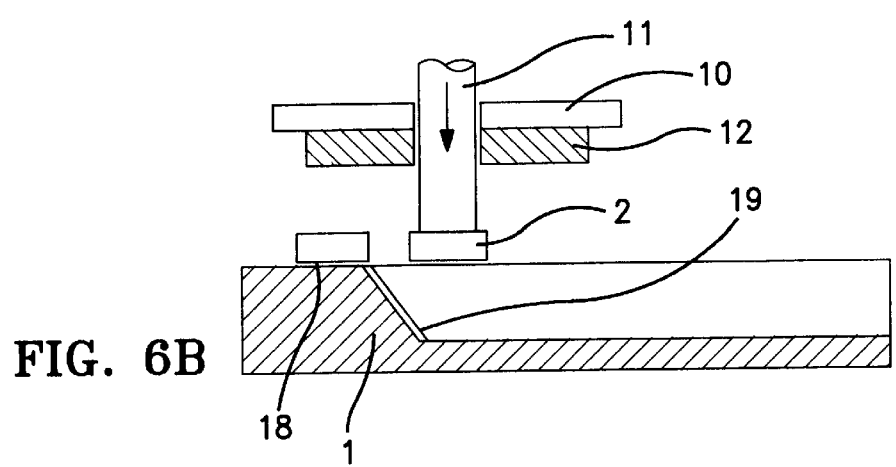
FIG. 6B is a cross sectional elevation view illustrative of solder bumps on solder bonding pads provided on a silicon wafer-board in a process of forming AuSn amorphous alloy solder bumps on the solder bonding pads provided on the silicon wafer-board in a second embodiment in accordance with the present invention.
Figure 7A:
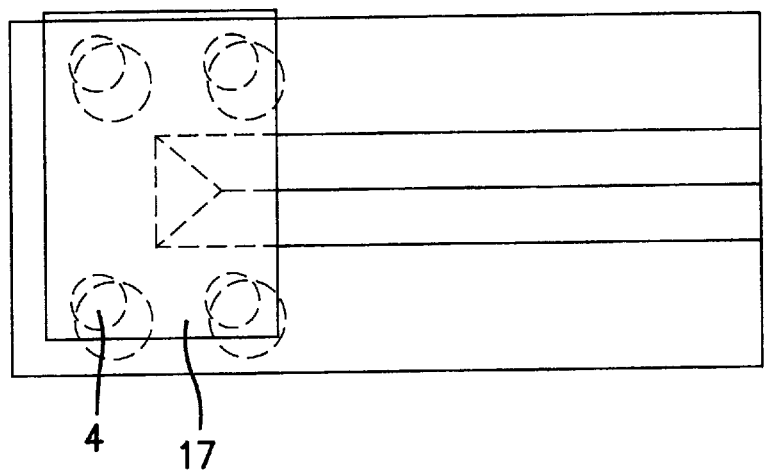
FIG. 7A is a plane view illustrative of a semiconductor photodetector provisionally placed on the AuSn amorphous alloy solder bumps on the solder bonding pads provided on the silicon wafer-board in a process of provisionally placing the semiconductor laser device onto the AuSn amorphous alloy solder bumps on the solder bonding pads provided on the silicon wafer-board in a second embodiment in accordance with the present invention.
Figure 7B:
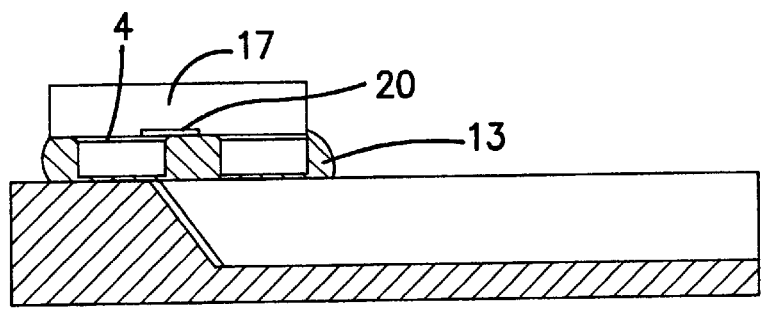
FIG. 7B is a cross sectional elevation view illustrative of a semiconductor photodetector provisionally placed on the AuSn amorphous alloy solder bumps on the solder bonding pads provided on the silicon wafer-board in a process of provisionally placing the semiconductor laser device onto the AuSn amorphous alloy solder bumps on the solder bonding pads provided on the silicon wafer-board in a second embodiment in accordance with the present invention.
Figure 9A:
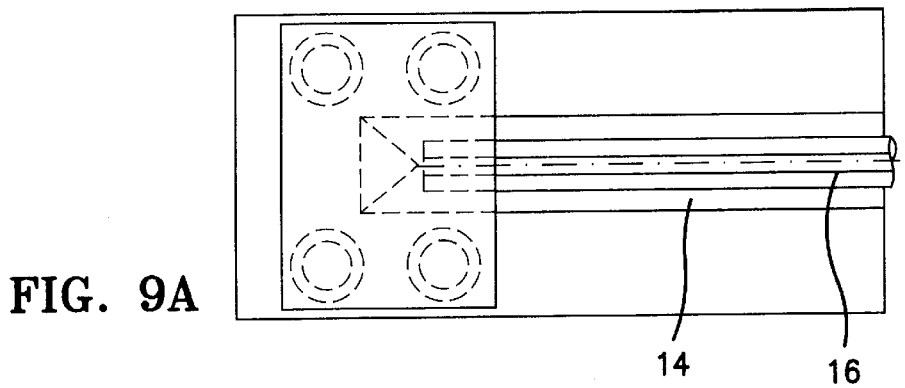
FIG. 9A is a fragmentary plane view illustrative of an optical fiber aligned to the semiconductor photodetector over the silicon wafer-board in a process of alignment to the semiconductor laser device in a second embodiment in accordance with the present invention.
Figure 9B:
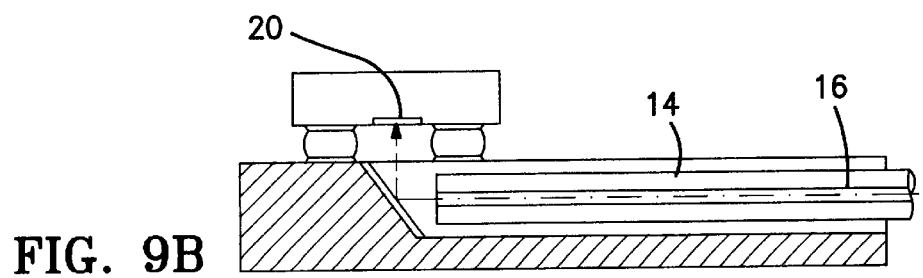
FIG. 9B is a fragmentary cross sectional elevation view illustrative of an optical fiber aligned to the semiconductor photodetector over the silicon wafer-board in a process of alignment to the semiconductor laser device in a second embodiment in accordance with the present invention.

Second Embodiment:

A second embodiment according to the present invention will be described in detail with reference to FIGS. 6A, 6B, 7A, 7B, 8, 9A and 9B wherein a novel method of bonding a semiconductor photodetector onto a silicon wafer-board through AuSn amorphous alloy solder bumps is provided. FIG. 6A is a plane view illustrative of solder bumps on solder bonding pads provided on a silicon wafer-board in a process of forming AuSn amorphous alloy solder bumps on the solder bonding pads provided on the silicon wafer-board. FIG. 6B is a cross sectional elevation view illustrative of solder bumps on solder bonding pads provided on a silicon wafer-board in a process of forming AuSn amorphous alloy solder bumps on the solder bonding pads provided on the silicon wafer-board. FIG. 7A is a plane view illustrative of a semiconductor photodetector provisionally placed on the AuSn amorphous alloy solder bumps on the solder bonding pads provided on the silicon wafer-board in a process of provisionally placing the semiconductor photodetector onto the AuSn amorphous alloy solder bumps on the solder bonding pads provided on the silicon wafer-board. FIG. 7B is a cross sectional elevation view illustrative of a semiconductor photodetector provisionally placed on the AuSn amorphous alloy solder bumps on the solder bonding pads provided on the silicon wafer-board in a process of provisionally placing the semiconductor photodetector onto the AuSn amorphous alloy solder bumps on the solder bonding pads provided on the silicon wafer-board. FIG. 8 is a fragmentary cross sectional elevation view illustrative of the semiconductor photodetector bonded through the AuSn amorphous alloy solder bumps to the solder bonding pads provided on the silicon wafer-board in a process of heat treatment to melt the solder bump and cause convection and cavitation of a chemically inactive liquid. FIG. 9A is a fragmentary plane view illustrative of an optical fiber aligned to the semiconductor photodetector over the silicon wafer-board in a process of alignment to the semiconductor photodetector. FIG. 9B is a fragmentary cross sectional elevation view illustrative of an optical fiber aligned to the semiconductor photodetector over the silicon wafer-board in a process of alignment to the semiconductor photodetector.

With reference to FIG. 6A, a V-shaped groove 6 is selectively formed in a silicon wafer-board 1 by a photolithography and subsequent an anisotropic etching using KOH. Further, solder bonding pads 18 are also formed on a top surface of the silicon wafer-board 1. An accuracy of relative position between the solder bonding pads 18 and the V-shaped groove 6 is limited by an accuracy in alignment of mask in the photolithography process. A light reflecting mirror 19 is formed on a sloped edge face of the V-shaped groove 6 With reference to FIG. 6B, an AuSn amorphous alloy solder sheet 10 is prepared and set over the silicon wafer-board 1. By use of small size punch 11 and dies 12, the AuSn amorphous alloy solder sheet 10 is punched to cut out AuSn amorphous alloy solder bumps 2 from the AuSn amorphous alloy solder sheet 10 before thermocompression bondings of the AuSn amorphous alloy solder bumps 2 onto the solder bonding pads are carried out. The thermocompression bonding may be carried out by use of the conventional techniques disclosed, for example, in Japanese laid-open patent publications Nos. 4-65847 and 4-152682.

With reference to FIGS. 7A and 7B, a chemically inactive liquid 13 is dropped over the AuSn amorphous alloy solder bumps 2 so that each of the AuSn amorphous alloy solder bumps 2 is immersed into the dropped chemically inactive liquid 13, wherein a surface of each of the AuSn amorphous alloy solder bumps 2 is coated with an oxide layer even not illustrated. The liquid 13 has a boiling point lower than a melting point of the AuSn amorphous alloy of the AuSn amorphous alloy solder bumps 2. The liquid may, for example, be a wax. A semiconductor photodetector 17 having a light receiving area 20 as a chip element is provided with solder bonding pads 4 at corresponding positions to the positions where the AuSn amorphous alloy solder bumps 2 are formed. The semiconductor photodetector 17 is provisionally placed on the silicon wafer-board 1 so that the AuSn amorphous alloy solder bumps 2 are aligned to the corresponding solder bonding pads 4 and the light receiving area 20 is positioned over the light reflective mirror 19 for receiving the light having been reflected by the light reflection mirror, whereby the AuSn amorphous alloy solder bumps 2 are made into contact with the corresponding solder bonding pads 4. A gap between the semiconductor photodetector 17 and the silicon wafer-board 1 is filled with the chemically inactive liquid.

With reference to FIG. 8, a heat treatment is carried out, for example, by use of a reflow furnace so that the solder bump 2 receives an energy or a heat energy and is melt, whereby the liquid 13 is also heated to cause a strong convection and a boiling. As the liquid is boiled, many bubbles are formed and then broken thereby to form pressure waves. Namely, the cavitation appears. The pressure waves give the surface of the solder bump 2 or the oxide layer 3 a damage whereby the oxide layer 3 is peeled and removed from the surface of the solder bump 2. The strong convection may also give the surface of the solder bump 2 or the oxide layer 3 a damage whereby the oxide layer 3 is peeled and removed from the surface of the solder bump.

Further, the solder bump 2 having been melt expands on an entire surface of the solder bonding pads 4 and 18 and exhibits a surface tension to be applied to the semiconductor photodetector 17 and the silicon wafer-board 1 in a direction parallel to bonding surfaces of the semiconductor photodetector 17 and the silicon wafer-board 1 for realizing a highly accurate self-alignment between the semiconductor photodetector 17 and the silicon wafer-board 1.

With reference to FIGS. 9A and 9B, an optical fiber 14 is aligned to the semiconductor photodetector 17 by use of the V-shaped groove 6. Then, the optical fiber 14 is fixed to the silicon wafer-board 1 by an adhesive, whereby an optical axis 15 of the semiconductor photodetector 17 is aligned at a high accuracy to a single core 16 of the optical fiber 14.

In the above novel method, each of the solder bonding pads 18 may comprise multi-layer structure of Ti-Pt-Au layers, wherein the Ti layer is adjacent to the silicon wafer-board. Each of the solder bonding pads 18 and 4 provided on the semiconductor photodetector 17 and the silicon wafer-board 1 respectively is cylindrically shaped to have a diameter of 70 micrometers and a thickness of 0.7 micrometers. A total height of the solder bump 2 and the solder bonding pads 18 and 4 after bonding process is 40 micrometers.

The above heat treatment may be carried out at a temperature of 300° C. for causing the solder bumps 2 to be melt and also causing the strong convection and cavitation of the chemically inactive liquid.

The AuSn amorphous alloy solder sheet 10 may have a thickness of 40 micrometers. The punch 11 may have a diameter of 90 micrometers. The AuSn amorphous alloy solder sheet 10 is heated at a temperature of 180° C. whilst the silicon wafer-board 1 is also heated at a temperature of 150° C. for subsequent punching process to cut out the AuSn amorphous alloy solder bumps 2 from the AuSn amorphous alloy solder sheet 10.

The core 16 of the optical fiber 14 is leveled lower by 70 micrometers than the surface of the first region of the silicon wafer-board 1.

The V-shaped groove 6 may be shaped that each of sloped faces consisting the V-valley has an angle of 54.7 degrees to the flat surface of the silicon wafer-board 1 and a width of the V-shaped groove 6 is 125 micrometers.

The optical fiber 14 may have a diameter of 125 micrometers. The chemically inactive liquid 13 having the lower boiling point than the melting point of the solder bump material may comprise a wax.

As modification to this embodiment, instead of AuSn, PbSn-based materials, AuSi-based materials and In-based materials are, for example, available.

In place of the semiconductor photodetector, any other optical devices such as a semiconductor light amplifier optical waveguide photodetector and a semiconductor optical modulator are also available.

As a non-solder-bonding metal film, a silicon dioxide layer, a silicon nitride layer and a resin layer are available provided that the film has a good adhesion with the solder bonding pad and has incapability of allowing an application of the solder material.

As the optical waveguide, optical dividers, optical couplers and an optical switches are also available. The optical device, the optical waveguide and the optical fiber may have a single or multiple cores. It is also available to provide a spot-size converter at a light emitting portion or a light receiving portion of the optical device. Normally, coupling between the optical device such as the semiconductor laser and the optical waveguide is engaged with the problem with the coupling loss die to non-correspondence or difference in mode field between the optical device and the optical waveguide. The spot-size converter reduces the degree of the non-correspondence or difference to provide a high coupling efficiency. If no spot size converter is provided, it is preferable to provide an optical lens an edge of the optical fiber or the optical waveguide so as to reduce a difference in mode field between the optical device and the optical waveguide, thereby obtaining a highly efficient coupling. Further, it is also possible to provide the spot-size converter between the optical device and the optical waveguide. The spot-size converter reduces the degree of the non-correspondence or difference to provide a high coupling efficiency.

The above chemically inactive liquid may also comprise other liquids than the wax, provided that the liquids are free of the problem with the residue and also incapable of oxidation or corrosion. For example, alkane system liquids such as heptane and octane as well as glycerins are also available.

As a furthermore modification to this embodiment, it is available to provide the solder bumps on the solder bonding pads provided on the chip element before the bonding process.

Figure 10A:
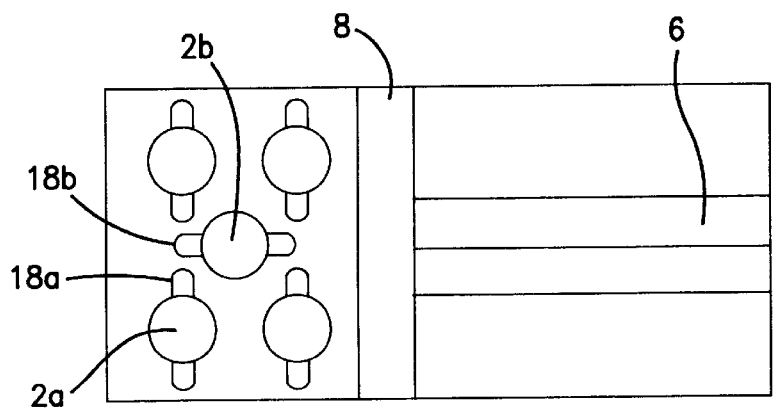
FIG. 10A is a plane view illustrative of solder bumps on solder bonding pads provided on a silicon wafer-board in a process of forming AuSn amorphous alloy solder bumps on the solder bonding pads provided on the silicon wafer-board in a third embodiment in accordance with the present invention.
Figure 10B:
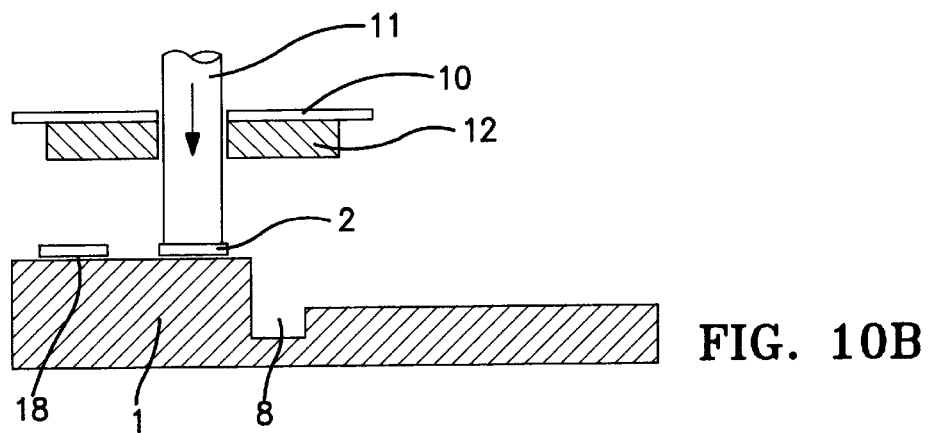
FIG. 10B is a cross sectional elevation view illustrative of solder bumps on solder bonding pads provided on a silicon wafer-board in a process of forming AuSn amorphous alloy solder bumps on the solder bonding pads provided on the silicon wafer-board in a third embodiment in accordance with the present invention.
Figure 11A:
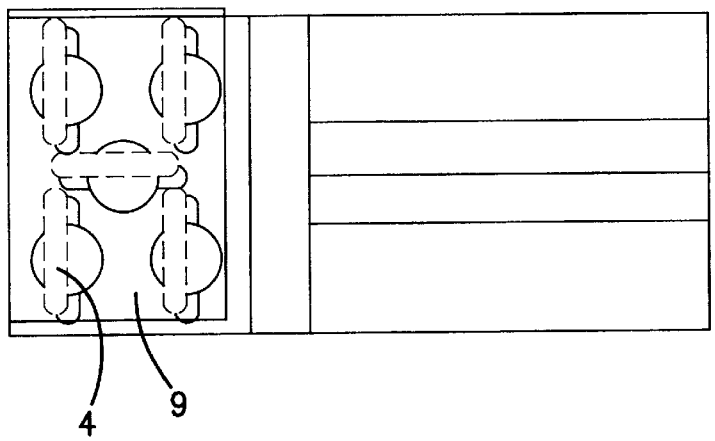
FIG. 11A is a plane view illustrative of a semiconductor laser device provisionally placed on the AuSn amorphous alloy solder bumps on the solder bonding pads provided on the silicon wafer-board in a process of provisionally placing the semiconductor laser device onto the AuSn amorphous alloy solder bumps on the solder bonding pads provided on the silicon wafer-board in a third embodiment in accordance with the present invention.
Figure 11B:
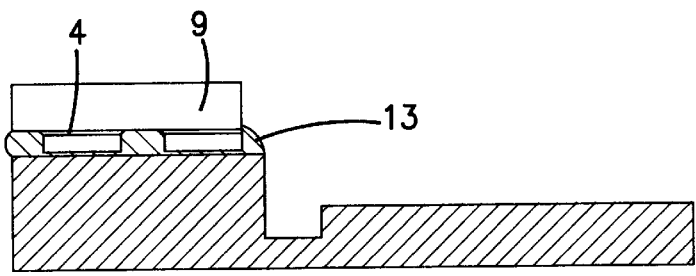
FIG. 11B is a cross sectional elevation view illustrative of a semiconductor laser device provisionally placed on the AuSn amorphous alloy solder bumps on the solder bonding pads provided on the silicon wafer-board in a process of provisionally placing the semiconductor laser device onto the AuSn amorphous alloy solder bumps on the solder bonding pads provided on the silicon wafer-board in a third embodiment in accordance with the present invention.
Figure 13A:
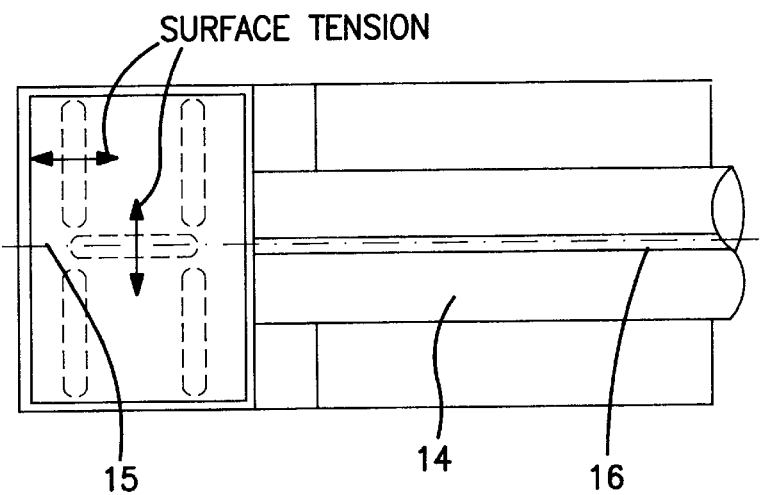
FIG. 13A is a fragmentary plane view illustrative of an optical fiber aligned to the semiconductor laser device over the silicon wafer-board in a process of alignment to the semiconductor laser device in a third embodiment in accordance with the present invention.
Figure 13B:
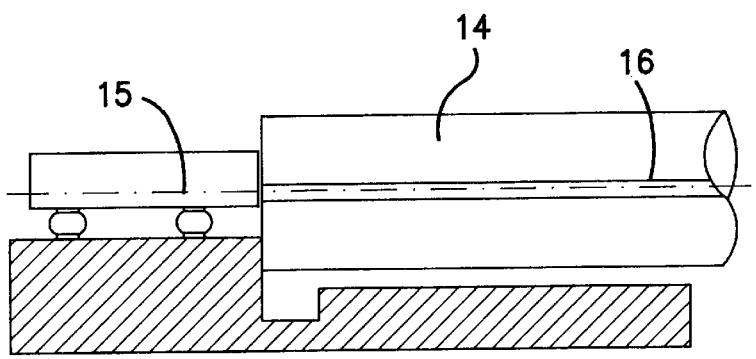
FIG. 13B is a fragmentary cross sectional elevation view illustrative of an optical fiber aligned to the semiconductor laser device over the silicon wafer-board in a process of alignment to the semiconductor laser device in a third embodiment in accordance with the present invention.
Figure 12:
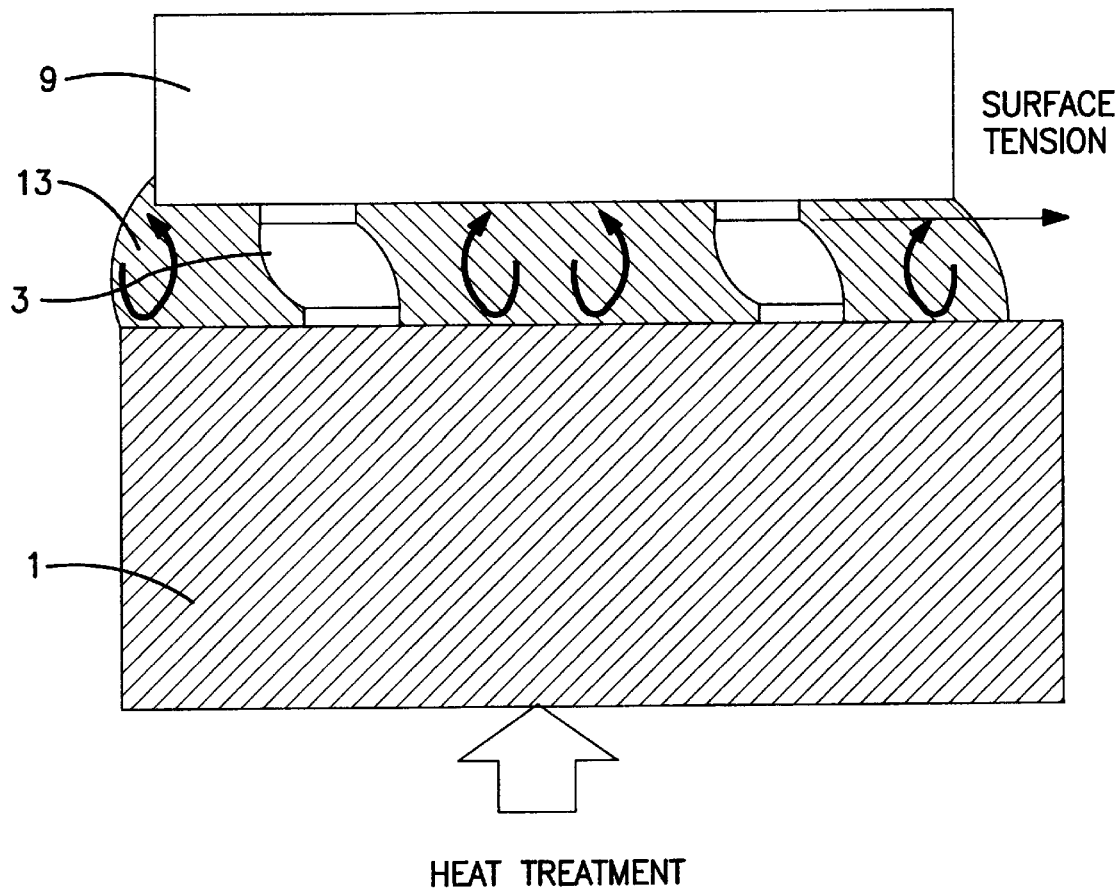
FIG. 12 is a fragmentary cross sectional elevation view illustrative of the semiconductor laser device bonded through the AuSn amorphous alloy solder bumps to the solder bonding pads provided on the silicon wafer-board in a process of heat treatment to melt the solder bump and cause convection and cavitation of a chemically inactive liquid in a third embodiment in accordance with the present invention.

Third Embodiment:

A third embodiment according to the present invention will be described in detail with reference to FIGS. 10A, 10B, 11A, 11B, 12, 13A and 13B wherein a novel method of bonding a semiconductor laser device onto a silicon wafer-board through AuSn amorphous alloy solder bumps is provided. FIG. 10A is a plane view illustrative of solder bumps on solder bonding pads provided on a silicon wafer-board in a process of forming AuSn amorphous alloy solder bumps on the solder bonding pads provided on the silicon wafer-board. FIG. 10B is a cross sectional elevation view illustrative of solder bumps on solder bonding pads provided on a silicon wafer-board in a process of forming AuSn amorphous alloy solder bumps on the solder bonding pads provided on the silicon wafer-board. FIG. 11A is a plane view illustrative of a semiconductor laser device provisionally placed on the AuSn amorphous alloy solder bumps on the solder bonding pads provided on the silicon wafer-board in a process of provisionally placing the semiconductor laser device onto the AuSn amorphous alloy solder bumps on the solder bonding pads provided on the silicon wafer-board. FIG. 11B is a cross sectional elevation view illustrative of a semiconductor laser device provisionally placed on the AuSn amorphous alloy solder bumps on the solder bonding pads provided on the silicon wafer-board in a process of provisionally placing the semiconductor laser device onto the AuSn amorphous alloy solder bumps on the solder bonding pads provided on the silicon wafer-board. FIG. 12 is a fragmentary cross sectional elevation view illustrative of the semiconductor laser device bonded through the AuSn amorphous alloy solder bumps to the solder bonding pads provided on the silicon wafer-board in a process of heat treatment to melt the solder bump and cause convection and cavitation of a chemically inactive liquid. FIG. 13A is a fragmentary plane view illustrative of an optical fiber aligned to the semiconductor laser device over the silicon wafer-board in a process of alignment to the semiconductor laser device. FIG. 13B is a fragmentary cross sectional elevation view illustrative of an optical fiber aligned to the semiconductor laser device over the silicon wafer-board in a process of alignment to the semiconductor laser device.

With reference to FIG. 10A, a V-shaped groove 6 is selectively formed in a silicon wafer-board 1 by a photolithography and subsequent an anisotropic etching using KOH. Further, solder bonding pads 18 are also formed on a top surface of the silicon wafer-board 1. An accuracy of relative position between the solder bonding pads 18 and the V-shaped groove 6 is limited by an accuracy in alignment of mask in the photolithography process. Furthermore, a trench groove 8 is also selectively formed by a cutting process so that the trench groove 8 extends perpendicular to the V-shaped groove 6 and the trench groove 8 isolates the surface region of the silicon wafer-board 1 into first and second regions, wherein the solder bonding pads 18 are formed on the first region whilst the V-shaped groove 6 extends on the second region.

With reference to FIG. 10B, an AuSn amorphous alloy solder sheet 10 is prepared and set over the silicon wafer-board 1. By use of small size punch 11 and dies 12, the AuSn amorphous alloy solder sheet 10 is punched to cut out AuSn amorphous alloy solder bumps 2a and 2b from the AuSn amorphous alloy solder sheet 10 before thermocompression bondings of the AuSn amorphous alloy solder bumps 2a and 2b onto the solder bonding pads are carried out. The solder bonding pads 18 comprise four first type slender solder bonding pads 18a extending in the same direction as the trench groove 8 and a single second type slender solder bonding pad 18b extending in the same direction as the V-shaped groove 6. Four first type solder bumps 2a are provided on the four first type slender solder bonding pads 18a whilst a single second type solder bump 2b is provided on the single second type slender solder bonding pad 18b. The thermocompression bonding may be carried out by use of the conventional techniques disclosed, for example, in Japanese laid-open patent publications Nos. 4-65847 and 4-152682.

With reference to FIGS. 11A and 11B, a chemically inactive liquid 13 is dropped over the AuSn amorphous alloy solder bumps 2a and 2b so that each of the AuSn amorphous alloy solder bumps 2a and 2b is immersed into the dropped chemically inactive liquid 13, wherein a surface of each of the AuSn amorphous alloy solder bumps 2a and 2b is coated with an oxide layer even not illustrated. The liquid 13 has a boiling point lower than a melting point of the AuSn amorphous alloy of the AuSn amorphous alloy solder bumps 2a and 2b. The liquid may, for example, be a wax. A semiconductor laser device 9 as a chip element is provided with solder bonding pads 4 at corresponding positions to the positions where the AuSn amorphous alloy solder bumps 2a and 2b are formed. The semiconductor laser device 9 is provisionally placed on the silicon wafer-board 1 so that the AuSn amorphous alloy solder bumps 2a and 2b are aligned to the corresponding solder bonding pads 4, whereby the AuSn amorphous alloy solder bumps 2a and 2b are made into contact with the corresponding solder bonding pads 4. A gap between the semiconductor laser device 9 and the silicon wafer-board 1 is filled with the chemically inactive liquid.

With reference to FIG. 12, a heat treatment is carried out, for example, by use of a reflow furnace so that the solder bump 2 receives an energy or a heat energy and is melt, whereby the liquid 13 is also heated to cause a strong convection and a boiling. As the liquid is boiled, many bubbles are formed and then broken thereby to form pressure waves. Namely, the cavitation appears. The pressure waves give the surface of the solder bump 2 or the oxide layer 3 a damage whereby the oxide layer 3 is peeled and removed from the surface of the solder bump 2. The strong convection may also give the surface of the solder bump 2 or the oxide layer 3 a damage whereby the oxide layer 3 is peeled and removed from the surface of the solder bump.

Further, the solder bump 2 having been melt expands on an entire surface of the solder bonding pads 4 and 18. The first type solder bumps 2a provided on the first type slender solder bonding pads 18a exhibit a surface tension to be applied to the semiconductor laser device 9 and the silicon wafer-board 1 in a direction parallel to the same direction in which the first type slender solder bonding pads 18a extend. The second type solder bump 2b provided on the second type slender solder bonding pads 18b exhibit a surface tension to be applied to the semiconductor laser device 9 and the silicon wafer-board 1 in a direction parallel to the same direction in which the second type slender solder bonding pad 18b extend. A highly accurate self-alignment between the semiconductor laser device 9 and the silicon wafer-board 1 can be obtained.

With reference to FIGS. 13A and 13B, an optical fiber 14 is aligned to the semiconductor laser device 9 by use of the V-shaped groove 6 and the trench groove 8. Then, the optical fiber 14 is fixed to the silicon wafer-board 1 by an adhesive. The edge of the optical fiber 14 is made into securely contact with the vertical side wall of the trench groove 8 whereby an optical axis 15 of the semiconductor laser device 9 is aligned at a high accuracy to a single core 16 of the optical fiber 14.

In the above novel method, each of the solder bonding pads 18 may comprise multi-layer structure of Ti—Pt—Au layers, wherein the Ti layer is adjacent to the silicon wafer-board. Each of the solder bonding pads 18 and 4 provided on the semiconductor laser device 9 and the silicon wafer-board 1 respectively is cylindrically shaped to have a diameter of 50 micrometers and a thickness of 0.7 micrometers. A total height of the solder bump 2 and the solder bonding pads 18 and 4 after bonding process is 18 micrometers.

The above heat treatment may be carried out at a temperature of 300° C. for causing the solder bumps 2a and 2b to be melt and also causing the strong convection and cavitation of the chemically inactive liquid.

The AuSn amorphous alloy solder sheet 10 may have a thickness of 20 micrometers. The punch 11 may have a diameter of 60 micrometers. The AuSn amorphous alloy solder sheet 10 is heated at a temperature of 180° C. whilst the silicon wafer-board 1 is also heated at a temperature of 150° C. for subsequent punching process to cut out the AuSn amorphous alloy solder bumps 2a and 2b from the AuSn amorphous alloy solder sheet 10.

The core 16 of the optical fiber 14 is leveled higher by 22 micrometers than the surface of the first region of the silicon wafer-board 1.

The V-shaped groove 6 may be shaped that each of sloped faces consisting the V-valley has an angle of 54.7 degrees to the flat surface of the silicon wafer-board 1 and a width of the V-shaped groove 6 is 165 micrometers.

The optical fiber 14 may have a diameter of 125 micrometers. The chemically inactive liquid 13 having the lower boiling point than the melting point of the solder bump material may comprise a wax.

As modification to this embodiment, instead of AuSn, PbSn-based materials, AuSi-based materials and In-based materials are, for example, available.

In place of the semiconductor laser device, any other optical devices such as a semiconductor light amplifier optical waveguide photodetector and a semiconductor optical modulator are also available.

As a non-solder-bonding metal film, a silicon dioxide layer, a silicon nitride layer and a resin layer are available provided that the film has a good adhesion with the solder bonding pad and has incapability of allowing an application of the solder material.

As the optical waveguide, optical dividers, optical couplers and an optical switches are also available. The optical device, the optical waveguide and the optical fiber may have a single or multiple cores. It is also available to provide a spot-size converter at a light emitting portion or a light receiving portion of the optical device. Normally, coupling between the optical device such as the semiconductor laser and the optical waveguide is engaged with the problem with the coupling loss die to non-correspondence or difference in mode field between the optical device and the optical waveguide. The spot-size converter reduces the degree of the non-correspondence or difference to provide a high coupling efficiency. If no spot size converter is provided, it is preferable to provide an optical lens an edge of the optical fiber or the optical waveguide so as to reduce a difference in mode field between the optical device and the optical waveguide, thereby obtaining a highly efficient coupling. Further, it is also possible to provide the spot-size converter between the optical device and the optical waveguide. The spot-size converter reduces the degree of the non-correspondence or difference to provide a high coupling efficiency.

The above chemically inactive liquid may also comprise other liquids than the wax, provided that the liquids are free of the problem with the residue and also incapable of oxidation or corrosion. For example, alkane system liquids such as heptane and octane as well as glycerins are also available.

As a furthermore modification to this embodiment, it is available to provide the solder bumps on the solder bonding pads provided on the chip element before the bonding process.

In order for the alignment of the optical fiber 14 to the semiconductor laser device, it is possible to provide a slit. If the optical fiber is fixed by the adhesive, it is also possible to form a groove or a hole through which the adhesive is discharged.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of removing an oxide layer which coats a surface of a solder bump at the same time when said solder bump is melt for a flip-chip bonding between a chip element and a wafer-board through said solder bump, said method comprising the steps of:

exposing said oxide layer coating said surface of said solder bump between said chip element and said wafer-board to a liquid; and causing at least one of a convection and a cavitation of at least an adjacent part of said liquid to said oxide layer by giving an energy to said solder bump for melting said solder bump, so as to allow said at least one of said convection and said cavitation to remove said oxide layer from said surface of said solder bump.

2. The method as claimed in claim 1, wherein said process of giving said energy to said solder bump comprises a heat treatment.

3. The method as claimed in claim 1, wherein said solder bump prior to said melting process is shaped to have two parallel and substantially flat surfaces which are in contact with bonding surfaces of said chip element and said wafer-board, whereby a reduction in height of said solder bump by melting said solder bump is suppressed.

4. The method as claimed in claim 3, wherein said solder bump is shaped by cutting out from a solder sheet.

5. The method as claimed in claim 1, wherein said liquid is chemically inactive.

6. The method as claimed in claim 5, wherein said liquid has no capability of oxidation and corrosion.

7. The method as claimed in claim 1, wherein said liquid has a boiling point which is not higher than a melting point of said solder bump.

8. The method as claimed in claim 7, wherein said liquid includes at least one selected from the group consisting of waxes, alkane system liquids and glycerins.

9. The method as claimed in claim 1, wherein said solder bump comprises at least one selected from the group consisting of AuSn-based solders, PbSn-based solders, AuSi-based solders, and In-based solders.

10. The method as claimed in claim 1, wherein said solder bump is bonded with a solder bonding pad provided on a bonding surface of said chip element.

11. The method as claimed in claim 10, wherein said solder bonding pad comprises an electrically conductive material which has a high resistivity to oxidation.

12. The method as claimed in claim 11, wherein said electrically conductive material of said solder bonding pad comprises at least one selected from the group consisting of Au and Pt.

13. The method as claimed in claim 10, wherein said solder bump has a larger size than said solder bonding pad in view of a plane parallel to said bonding surfaces of said chip element and said wafer-board.

14. The method as claimed in claim 1, wherein a gap between said chip element and said wafer-board is filled with said liquid so that said solder bump is immersed in said liquid in order to allow said solder bump melt to exhibit a surface tension to be applied to said chip element and said wafer-board in a direction parallel to bonding surfaces of said chip element and said wafer-board for causing a self-alignment between said chip element and said wafer-board.

15. A method of bonding a chip element to a wafer-board through at least a solder bump having a surface coated with an oxide layer placed between said chip element and said wafer-board, said method comprising the steps of:

exposing said oxide layer coating said surface of said solder bump to a liquid; and giving an energy to said solder bump both for melting said solder bump and for causing at least one of a convection and a cavitation of at least an adjacent part of said liquid to said oxide layer, so as to allow said at least one of said convection and said cavitation to remove said oxide layer from said surface of said solder bump, whereby said solder bump bonds said chip element and said wafer-board.

16. The method as claimed in claim 15, wherein said process of giving said energy to said solder bump comprises a heat treatment.

17. The method as claimed in claim 15, wherein said solder bump prior to said melting process is shaped to have two parallel and substantially flat surfaces which are in contact with bonding surfaces of said chip element and said wafer-board, whereby a reduction in height of said solder bump by melting said solder bump is suppressed.

18. The method as claimed in claim 17, wherein said solder bump is shaped by cutting out from a solder sheet.

19. The method as claimed in claim 15, wherein said liquid is chemically inactive.

20. The method as claimed in claim 19, wherein said liquid has no capability of oxidation and corrosion.

21. The method as claimed in claim 15, wherein said liquid has a boiling point which is not higher than a melting point of said solder bump.

22. The method as claimed in claim 21, wherein said liquid includes at least one selected from the group consisting of waxes, alkane system liquids and glycerins.

23. The method as claimed in claim 15, wherein said solder bump comprises at least one selected from the group consisting of AuSn-based solders, PbSn-based solders, AuSi-based solders, and In-based solders.

24. The method as claimed in claim 15, wherein said solder bump is bonded with a solder bonding pad provided on a bonding surface of said chip element.

25. The method as claimed in claim 24, wherein said solder bonding pad comprises an electrically conductive material which has a high resistivity to oxidation.

26. The method as claimed in claim 25, wherein said electrically conductive material of said solder bonding pad comprises at least one selected from the group consisting of Au and Pt.

27. The method as claimed in claim 24, wherein said solder bump has a larger size than said solder bonding pad in view of a plane parallel to said bonding surfaces of said chip element and said wafer-board.

28. The method as claimed in claim 15, wherein a gap between said chip element and said wafer-board is filled with said liquid so that said solder bump is immersed in said liquid in order to allow said solder bump melt to exhibit a surface tension to be applied to said chip element and said wafer-board in a direction parallel to bonding surfaces of said chip element and said wafer-board for causing a self-alignment between said chip element and said wafer-board.

29. A method of bonding between a chip element and a wafer-board through at least a solder bump having a surface coated with an oxide layer placed between said chip element and said wafer-board, said method comprising the steps of:

supplying a liquid chemically inactivate to a gap between said chip element and said wafer-board so as to immerse said oxide layer coating said surface of said solder bump into said liquid; and subjecting said solder bump to a heat treatment both for melting said solder bump and for causing at least one of a convection and a cavitation of at least an adjacent part of said liquid to said oxide layer, so as to allow said at least one of said convection and said cavitation to remove said oxide layer from said surface of said solder bump, whereby said solder bump bonds said chip element and said wafer-board as well as said solder bump melt exhibits a surface tension to be applied to said chip element and said wafer-board in a direction parallel to bonding surfaces of said chip element and said wafer-board for causing a self-alignment between said chip element and said wafer-board.

30. The method as claimed in claim 29, wherein said solder bump prior to said melting process is shaped to have two parallel and substantially flat surfaces which are in contact with bonding surfaces of said chip element and said wafer-board, whereby a reduction in height of said solder bump by melting said solder bump is suppressed.

31. The method as claimed in claim 30, wherein said solder bump is shaped by cutting out from a solder sheet.

32. The method as claimed in claim 29, wherein said liquid has no capability of oxidation and corrosion.

33. The method as claimed in claim 29, wherein said liquid has a boiling point which is not higher than a melting point of said solder bump.

34. The method as claimed in claim 33, wherein said liquid includes at least one selected from the group consisting of waxes, alkane system liquids and glycerins.

35. The method as claimed in claim 29, wherein said solder bump comprises at least one selected from the group consisting of AuSn-based solders, PbSn-based solders, AuSi-based solders, and In-based solders.

36. The method as claimed in claim 29, wherein said solder bump is bonded with a solder bonding pad provided on a bonding surface of said chip element.

37. The method as claimed in claim 36, wherein said solder bonding pad comprises an electrically conductive material which has a high resistivity to oxidation.

38. The method as claimed in claim 37, wherein said electrically conductive material of said solder bonding pad comprises at least one selected from the group consisting of Au and Pt.

39. The method as claimed in claim 36, wherein said solder bump has a larger size than said solder bonding pad in view of a plane parallel to said bonding surfaces of said chip element and said wafer-board.

40. A method of a flip-chip bonding between a chip element and a wafer-board through at least a solder bump having a surface coated with an oxide layer placed between a corresponding solder bonding pad provided on a bonding surface of said chip element and a bonding surface of said wafer-board, said method comprising the steps of:

providing said bonding surface of said wafer-board thereon with said solder bump which is shaped to have two parallel and substantially flat surfaces and which has a larger size than said solder bonding pad in view of a plane parallel to said bonding surfaces of said chip element and said wafer-board;

supplying a chemically inactivate liquid having no capability of oxidation and corrosion and having a boiling point not higher than a melting point of said solder bump into a gap between said chip element and said wafer-board so as to immerse said oxide layer coating said surface of said solder bump into said liquid; and subjecting said solder bump to a heat treatment both for melting said solder bump and for causing both a convection and a cavitation of at least an adjacent part of said liquid to said oxide layer, so as to allow both said convection and said cavitation to remove said oxide layer from said surface of said solder bump, whereby said solder bump bonds said chip element and said wafer-board as well as said solder bump melt exhibits a surface tension to be applied to said chip element and said wafer-board in a direction parallel to bonding surfaces of said chip element and said wafer-board for causing a self-alignment between said chip element and said wafer-board.

41. The method as claimed in claim 40, wherein said solder bump is shaped by cutting out from a solder sheet.

42. The method as claimed in claim 40, wherein said liquid includes at least one selected from the group consisting of waxes, alkane system liquids and glycerins.

43. The method as claimed in claim 40, wherein said solder bump comprises at least one selected from the group consisting of AuSn-based solders, PbSn-based solders, AuSi-based solders, and In-based solders.

44. The method as claimed in claim 40, wherein said solder bonding pad comprises an electrically conductive material which is highly resistive to oxidation.

45. The method as claimed in claim 44, wherein said electrically conductive material of said solder bonding pad comprises at least one selected from the group consisting of Au and Pt.

46. A method of a flip-chip bonding between a chip element and a wafer-board through at least a solder bump having a surface coated with an oxide layer placed between a corresponding solder bonding pad provided on a bonding surface of said chip element and a bonding surface of said wafer-board, said method comprising the steps of:

providing said solder bonding pad thereon with said solder bump which is shaped to have two parallel and substantially flat surfaces and which has a larger size than said solder bonding pad in view of a plane parallel to said bonding surfaces of said chip element and said wafer-board;

supplying a chemically inactivate liquid having no capability of oxidation and corrosion and having a boiling point not higher than a melting point of said solder bump into a gap between said chip element and said wafer-board so as to immerse said oxide layer coating said surface of said solder bump into said liquid; and subjecting said solder bump to a heat treatment both for melting said solder bump and for causing both a convection and a cavitation of at least an adjacent part of said liquid to said oxide layer, so as to allow both said convection and said cavitation to remove said oxide layer from said surface of said solder bump, whereby said solder bump bonds said chip element and said wafer-board as well as said solder bump melt exhibits a surface tension to be applied to said chip element and said wafer-board in a direction parallel to bonding surfaces of said chip element and said wafer-board for causing a self-alignment between said chip element and said wafer-board.

47. The method as claimed in claim 46, wherein said solder bump is shaped by cutting out from a solder sheet.

48. The method as claimed in claim 46, wherein said liquid includes at least one selected from the group consisting of waxes, alkane system liquids and glycerins.

49. The method as claimed in claim 46, wherein said solder bump comprises at least one selected from the group consisting of AuSn-based solders, PbSn-based solders, AuSi-based solders, and In-based solders.

50. The method as claimed in claim 46, wherein said solder bonding pad comprises an electrically conductive material which is highly resistive to oxidation.

51. The method as claimed in claim 50, wherein said electrically conductive material of said solder bonding pad comprises at least one selected from the group consisting of Au and Pt.

* * * * *